US005537059A

United States Patent [19]
Asahina

[11] Patent Number: 5,537,059
[45] Date of Patent: Jul. 16, 1996

[54] OUTPUT CIRCUIT OF SEMICONDUCTOR INTEGRATED CIRCUIT DEVICE

[75] Inventor: Katsushi Asahina, Itami, Japan

[73] Assignee: Mitsubishi Denki Kabushiki Kaisha, Tokyo, Japan

[21] Appl. No.: 523,753

[22] Filed: Sep. 5, 1995

Related U.S. Application Data

[63] Continuation of Ser. No. 159,240, Nov. 30, 1993, abandoned.

[30] Foreign Application Priority Data

Dec. 24, 1992 [JP] Japan ..................................... 4-343841

[51] Int. Cl.$^6$ ................. H03K 19/0185; H03K 19/0948
[52] U.S. Cl. ................ 326/81; 326/83; 327/543
[58] Field of Search ....................... 307/475, 451, 307/443, 473, 296.2, 296.8; 326/81.83, 68.86, 121, 57, 58, 21; 327/534, 538, 543

[56] References Cited

U.S. PATENT DOCUMENTS

| 5,021,684 | 6/1991 | Ahuja et al. | 307/296.8 |
|---|---|---|---|
| 5,109,187 | 4/1992 | Guliani | 327/530 |
| 5,136,191 | 8/1992 | Nunogami | 307/451 |
| 5,179,297 | 1/1993 | Hsueh et al. | 307/451 |
| 5,204,557 | 4/1993 | Nguyen | 307/475 |
| 5,270,589 | 12/1993 | Sawada et al. | 307/296.8 |
| 5,300,832 | 4/1994 | Rogers | 326/68 |

FOREIGN PATENT DOCUMENTS

| 4006144 | 5/1991 | Germany. |
|---|---|---|
| 4100116 | 7/1991 | Germany. |

OTHER PUBLICATIONS

Proceedings of the IEEE 1992 Custom Integrated Circuits Conference, May 1992, Makoto Takahashi, et al., "3.3V–5V Compatible I/O Circuit Without Thick Gate Oxide", pp. 23.3.1 to 23.3.4.

Primary Examiner—Edward P. Westin
Assistant Examiner—Jon Santamauro
Attorney, Agent, or Firm—Oblon, Spivak, McClelland, Maier & Neustadt

[57] ABSTRACT

An output circuit of a semiconductor integrated circuit device is obtained which can externally produce a signal lager in amplitude than an internal signal amplitude without degrading reliability of miniaturized transistors. A PMOS transistor (23) and an NMOS transistor (24) connected to an output terminal (5) cooperatively output a potential ($V_{DD2}$) at a power source or a potential ($V_{SS}$) at a ground as output voltage. A potential of an input signal, a potential ($V_{DD1}$) at a power source or the potential $V_{SS}$ at the ground, are converted by a first converting unit (K2) and a second converting unit (K3) to apply to a gate of the PMOS transistor (23). The first converting unit (k2) and the second converting unit (K3) utilize potential developed by an intermediate potential generating circuit and the potential ($V_{DD1}$) at the power source to convert the potential of the input signal. Thus, an output signal having a larger amplitude than the input signal amplitude can be produced without applying the potential difference of the potential ($V_{DD2}$) from the ground potential ($V_{SS}$) to insulated gate transistors (12 to 23) constituting the output circuit between their respective gates and substrate.

32 Claims, 12 Drawing Sheets

OUTPUT CIRCUIT OF SEMICONDUCTOR INTEGRATED CIRCUIT DEVICE

This application is a continuation of application Ser. No. 08/159,240, filed on Nov. 30, 1993, now abandoned.

BACKGROUND OF THE INVENTION

1. Field of the Invention

The present invention relates to an output circuit of a semiconductor integrated circuit device.

2. Description of the Prior Art

FIG. 12 depicts a prior art output circuit of a semiconductor integrated circuit device. Components shown in FIG. 12 include a first power source 1, ground 3, an input terminal 4 of the output circuit, an output terminal 5 of the output circuit, a PMOS transistor 40 having its gate connected to the input terminal 4, its source connected to the first power source 1, and its drain connected to the output terminal 5, and an NMOS transistor 41 having its gate connected to the input terminal 4, its source grounded, and its drain connected to the output terminal 5.

An operation of the output circuit will now be described. Voltages designated by $V_{DD1}$ and $V_{SS}$ are applied to the first power source 1 and the ground 3, respectively, and a signal designated by $V_{IN}$ is applied to the input terminal 4 of the output circuit. The PMOS transistor 40 and the NMOS transistor 41 constitute a CMOS inverter gate circuit. Thus, when the input signal $V_{IN}$ is equal to $V_{DD1}$, or over the threshold voltage of the inverter gate circuit, an output signal $V_{OUT}$ is is $V_{SS}$. When the input signal $V_{IN}$ is equal to $V_{SS}$, or below the threshold voltage, the output signal $V_{OUT}$ is $V_{DD1}$.

As to a miniaturized MOS semiconductor integrated circuit device, a gate insulating film constituting a MOS transistor is very thin about 10 nm to 14 nm. Thus, the supply voltage $V_{DD1}$ applied to the miniaturized MOS semiconductor integrated circuit device is lower, compared with a prior art MOS semiconductor integrated circuit device, in order to prevent dielectric breakdown of the gate insulating film or prevent the threshold voltage of the MOS transistor from being varied due to hot electrons which are developed while the MOS transistor is operated, injected into the gate insulating film, and remains as fixed electric charge in the insulating film. The output voltage $V_{OUT}$ from the output circuit of the semiconductor integrated circuit device shown in FIG. 12 satisfies $V_{SS} < V_{OUT} < V_{DD1}$. In the event that a method of connecting an output terminal of the output circuit of the semiconductor integrated circuit device via a pull-up resistance 42 to a second power source 2 of potential $VDD_2$ is as shown in FIG. 13, this circuitry cannot be used if $V_{DD1} < V_{DD2}$, because a P-type semiconductor and an N-type substrate of a source electrode of the PMOS transistor 40 are forwardly biased.

Another prior art semiconductor integrated circuit device is shown in FIG. 14. The device shown in FIG. 14 is generally comprised of an output circuit K20 having outputs in three states like $V_{DD2}$, $V_{SS}$ and a high impedance condition, and an output circuit K21 having outputs in three states like $V_{DD1}$, $V_{SS}$ and a high impedance condition, and it also includes a PMOS transistor 50 having its source connected to a power source 2 of supply voltage $V_{DD2}$ and its drain connected to a bus line 55 to constitute an output stage of the output circuit K20, an NMOS transistor 51 having its source grounded to the ground potential $V_{SS}$ and its drain connected to the bus line 55 to constitute an output stage of the output circuit K20, a PMOS transistor 52 having its source connected to a power source 1 of supply voltage $V_{DD1}$ and its drain connected to the bus line 55 to constitute an output stage of the output circuit K21, an NMOS transistor 53 having its source grounded to the ground potential $V_{SS}$ and its drain connected to the bus line 55 to constitute an output stage of the output circuit K21, and a pull-up resistance 54 having its one end connected to the power source 2 and the other end connected to the bus line 55 to pull up a potential of the bus line 55 to $V_{DD2}$. The output circuits K20 and K21 output different voltages corresponding to logics to produce and are connected commonly to the bus line 55, and therefore, a problem as follows arises; in the event that the output circuit K21 is in the high impedance condition while the output circuit K20 outputs $V_{DD2}$, a P-type semiconductor and an N-type substrate constituting a source of the PMOS transistor 52 are forwardly biased to cause current to inconveniently flow in the first power source.

As has been described, an output circuit of the prior art semiconductor integrated circuit device configured as stated above has the disadvantage that it cannot externally output a signal having a larger amplification than an internal signal of the semiconductor integrated circuit.

There is also the disadvantage that output circuits of which input signals are different in amplitude cannot be commonly connected.

SUMMARY OF THE INVENTION

An output circuit of a semiconductor integrated circuit device according to the present invention comprises an input signal potential converting circuit having a plurality of insulated gate transistors, which receive an input signal oscillating between a first potential and a second potential lower than the first potential and an inverted logic to the input signal and which is connected to a third potential higher than the first potential to generate a signal oscillating between the third potential and a fourth potential higher than the second potential in accordance with the input signal and the inverted logic; voltages between substrate and control electrodes of the plurality of insulated gate transistors being smaller than the potential difference between the second potential and the third potential; the output circuit further comprising a first insulated gate transistor of a first conductivity type having a control electrode for receiving an output signal of the input signal potential converting circuit, a first electrode connected to the third potential and a second electrode connected to an output terminal, and having a substrate potential of the third potential.

According to the present invention, the input signal potential converting circuit receives an input signal oscillating between a first potential and a second potential and an inverted logic to the input signal, and outputs the signal oscillating the third potential and the fourth potential. Then, the first insulated gate transistor is able to output the third potential from its second electrode because of receiving the signal generated by the input signal potential converting circuit at its control electrode.

Since voltages between substrate and control electrodes of the plurality of insulated gate transistors are adapted to be smaller than the potential difference between the second potential and the third potential, the output circuit can effectively output the signal having an amplitude larger than a signal amplitude of an input circuit without degrading reliability of the insulated gate transistors. Eventually, these kinds of output circuits have their respective output terminals connected commonly to one another regardless of input signals received therein.

Preferably, the input signal potential converting circuit includes an intermediate potential generating circuit generating an intermediate potential between the first and second potentials, a first converting unit connected to the second and third potentials, and receiving the intermediate potential generated by the intermediate potential generating circuit and the input signal and utilizing the intermediate potential to generate a signal oscillating between a fifth potential close to the third potential and a sixth potential lower than the fifth potential generated in accordance with the input signal, and a second converting unit connected to the second and third potentials, and receiving the intermediate potential generated by the intermediate potential generating circuit, the inverted logic to the input signal, and the signal output from the first converting unit and utilizing the intermediate potential to output the third or fourth potential to the control electrode of the first insulated gate transistor in accordance with the inverted logic and the signal output from the first converting unit.

According to the present invention, the first converting unit outputs the fifth potential or the sixth potential, and the second converting unit can output the third potential or the fourth potential because of utilizing the intermediate potential and the signal output from the first converting unit. In other words, it is easy to convert the potential on the output signal by a two step-signal-processing.

Thus, the output circuit of the semiconductor integrated circuit device can output a signal of an amplitude larger than a signal amplitude of the input circuit without degrading reliability of the insulated gate transistors.

Preferably, the output circuit of the semiconductor integrated circuit device further comprises a second insulated gate transistor of the second conductivity type which is different from the first conductivity type having a first electrode connected to the second potential, a second electrode connected to the output terminal, and a control electrode.

According to the present invention, the first or second insulated gate transistor turns on in accordance with the input signal.

Thus, the output circuit effectively produces a binary output signal in accordance with a binary input signal received therein.

Preferably, the output circuit of the semiconductor integrated circuit device further comprises a control circuit provided in the first stage of the input signal potential converting circuit, receiving the input signal and a control signal to output a signal to the input signal potential converting circuit and the second insulated gate transistor so that the signal works to turn off either the first or second insulated gate transistor in accordance with the input signal or to simultaneously turn off both the first and second insulated gate transistors regardless of the input signal.

According to the present invention, the control circuit outputs the signal to the input signal potential converting circuit and the second insulated gate transistor to turn off either the first or second insulated gate transistor in accordance with the input signal or to simultaneously turn off both the first and second insulated gate transistors regardless of the input signal.

Hence, the output circuit effectively produces an output in any of three states, that is, it outputs either of two logics in accordance with the input signal or the output terminal is in a high impedance condition.

Preferably, the plurality of insulated gate transistors include third to ninth insulated gate transistors; the first converting unit comprising voltage dropping means having a first terminal connected to the third potential, and a second terminal, the third insulated gate transistor of the second conductivity type having a first electrode connected to the second terminal of the voltage dropping means, a control electrode connected to the first potential, and a second electrode, the fourth insulated gate transistor of the first conductivity type having a first electrode connected to the second electrode of the third insulated gate transistor, a control electrode receiving the intermediate potential generated by the intermediate potential generating circuit, and a second electrode, and the fifth insulated gate transistor having a first electrode connected to the second potential, a second electrode connected to the second electrode of the fourth insulated gate transistor, and a control electrode receiving the input signal; and the second converting unit comprising the sixth insulated gate transistor of the first conductivity type having a first electrode receiving the third potential, a control electrode connected to the second terminal of the voltage dropping means, and a second electrode, the seventh insulated gate transistor having a first electrode connected to the second electrode of the sixth insulated gate transistor, a control electrode connected to the first potential, and a second electrode, the eighth insulated gate transistor of the first conductivity type having a first electrode connected to the second electrode of the seventh insulated gate transistor, a control electrode receiving the intermediate potential generated by the intermediate potential generating circuit, and a second electrode, and the ninth insulated gate transistor of the second conductivity type serially provided between the second potential and the second electrode of the eighth insulated gate transistor and having a control electrode input on which the inverted logic to the input signal is received.

According to the present invention, the lower limit on the potential at the control electrode of the sixth insulated gate transistor is given by subtracting the threshold voltage of the third insulated gate transistor from the first potential, the lower limit on the potential at the control electrode of the first insulated gate transistor is given by subtracting the threshold voltage of the seventh insulated gate transistor from the first potential, the lower limit on the potential at the second electrode of the fifth insulated gate transistor is given by subtracting the threshold voltage of the fourth insulated gate transistor from the intermediate potential, and the lower limit on the potential at the second electrode of the ninth insulated gate transistor is given by subtracting the threshold voltage of the eighth insulated gate transistor from the intermediate potential.

Thus, the voltages appearing across the insulated gate transistors which consist the input signal potential converting circuit is smaller than the potential difference between the second potential and the third potential.

Thus, the output circuit of the semiconductor integrated circuit device which never degenerate reliability of the insulated gate transistors can be easily accomplished.

Preferably, the second converting unit further comprises a level shift circuit connected between the first electrode of the sixth insulated gate transistor and the third potential for increasing a voltage drop between the second potential and the first electrode of the sixth insulated gate transistor when the potential difference between the control electrode of the sixth insulated gate transistor and its first electrode decreases to cause transition of the sixth insulated gate transistor into its OFF-state.

According to the present invention, since the level shift circuit suppresses the voltage between the control electrode and the first electrode of the sixth insulated gate transistor, the current flow from the first electrode to the second electrode of the sixth insulated gate transistor is reduced considerably.

Hence, power demand can be effectively reduced in the output circuit of the semiconductor integrated circuit device which produces the output signal of a larger amplitude than the signal amplitude of the input circuit, without degrading reliability of the insulated gate transistors.

Preferably, the plurality of insulated gate transistors further include a tenth insulated gate transistor; the voltage dropping means comprising the tenth insulated gate transistor of the first conductivity type having a first electrode connected to the third potential, and a control electrode and second electrode connected to the first electrode of the third insulated gate transistor; and the sixth insulated gate transistor including an insulated gate transistor having a higher threshold voltage than the tenth insulated gate transistor.

According to the present invention, since the threshold voltage of the sixth insulated gate transistor is higher than the threshold voltage of the tenth insulated gate transistor, the current flowing from the first electrode to the second electrode of the sixth insulated gate transistor is reduced considerably, when the sixth insulated gate transistor turns off.

Hence, power demand can be effectively reduced in the output circuit of the semiconductor integrated circuit device which produces the output signal having a larger amplitude than the signal amplitude of the input circuit, without degrading reliability of the insulated gate transistors.

Preferably, the second converting unit further comprises resistance means having a first terminal connected to the second electrode of the eighth insulated gate transistor, and a second terminal connected to the first electrode of the ninth insulated gate transistor.

According to the present invention, since the current flowing into the ninth insulated gate transistor is suppressed by the resistance means, the noise signal excited on an output inductance by the rapid change of the output voltage is reduced.

Thus, there can effectively be obtained the output circuit of the semiconductor integrated circuit device which is highly reliable because noise signal is reduced.

Preferably, the input signal potential converting circuit comprises an intermediate potential generating circuit generating an intermediate potential between the first and second potentials, a first converting unit connected to the second and third potentials, and receiving the intermediate potential generated by the intermediate potential generating circuit and the input signal and utilizing the intermediate potential to generate a signal oscillating between a fifth potential close to the third potential and a sixth potential lower than the fifth potential in accordance with the input signal, and a second converting unit connected to the second and third potentials, and receiving the intermediate potential generated by the intermediate potential generating circuit, the inverted logic to the input signal, and the signal output from the first converting unit and utilizing the intermediate potential to output the third or fourth potential to the control electrode of the first insulated gate transistor in accordance with the inverted logic and the signal output from the first converting unit; the first converting unit including serial circuitry connected between the third and second potentials, and a circuit serially interposed in the serial circuitry and receiving a logic or inverted logic converted by the second converting unit to suppress current in accordance with the logic or inverted logic.

According to the present invention, the first converting unit outputs the fifth potential or the sixth potential, and the second converting units can output the fourth potential because of utilizing the intermediate potential and the signal output from the first converting unit. In other words, it is easy to convert the potential on the output signal by a two-step-signal-processing. And the circuit suppressing current of the first converting unit is able to reduce power demand of the first converting unit in accordance with the output of the second unit.

Thus, power demand can be effectively reduced in the output circuit of the semiconductor integrated circuit device which produces the output signal having a larger amplitude than the signal amplitude of the input circuit, without degrading reliability of the insulated gate transistors.

Accordingly, it is an object of the present invention to provide an output circuit of a semiconductor integrated circuit device, which can externally output a signal having a larger amplitude than an internal signal amplitude.

It is another object of the present invention to enable outputs of output circuits of which input signals are different in amplitude to be commonly connected.

These and other objects, features, aspects, and advantages of the present invention will become more apparent from the following detailed description of the present invention when taken in conjunction with the accompanying drawings.

DETAILED DESCRIPTION OF THE PREFERRED EMBODIMENT

EMBODIMENT 1

Figure 1:
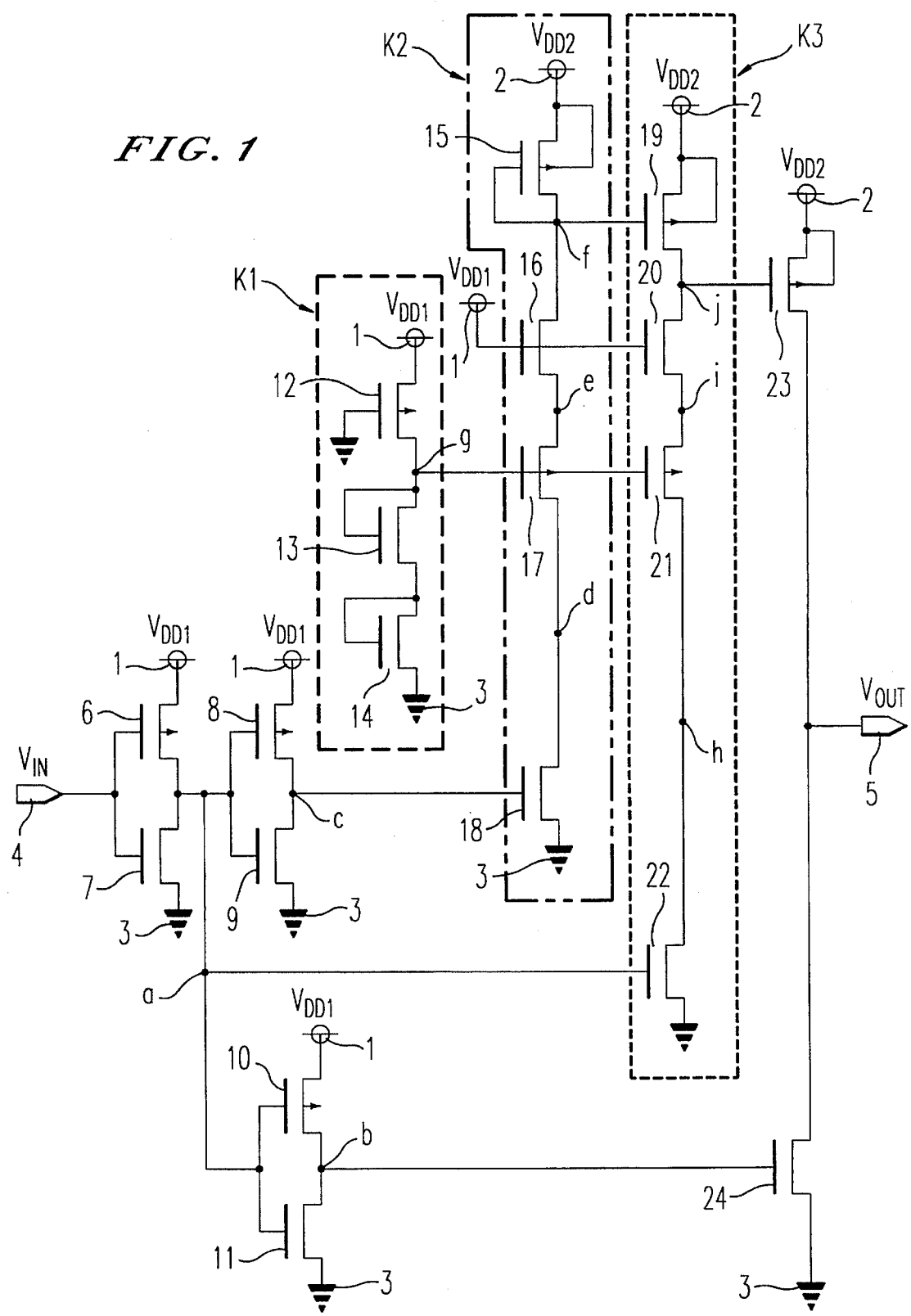
FIG. 1 is a diagram showing an output circuit of a semiconductor integrated circuit device according to a first preferred embodiment of the present invention.

A first preferred embodiment of the present invention will be described with reference to the drawings. FIG. 1 is a circuit diagram showing a structure of an output circuit of a semiconductor integrated circuit device according to the first preferred embodiment of the present invention. The circuit shown in FIG. 1 includes first power sources 1, second power sources 2, grounds 3, an input terminal 4 of the output circuit, an output terminal 5 of the output circuit, PMOS transistors 6, 8, 10, 12, 15, 17, 19, 21 and 23, and NMOS transistors 7, 9, 11, 13, 14, 16, 18, 20, 22 and 24.

It now is assumed that a potential output by the first power source 1 is $V_{DD1}$, a potential output by the second power source 2 is $V_{DD2}$, a potential of the ground 3 is $V_{SS}$ and that voltage designated by $V_{IN}$ is applied to the input terminal 4 of the output circuit. The potential $V_{DD1}$ of the first power source 1 is lower than the potential $V_{DD2}$ of the second power source 2 for an external output circuit so as to assure reliability of a miniaturized MOS transistor. The substrate potential of all the NMOS transistors is $V_{SS}$. The substrate potential of all the PMOS transistors is $V_{DD1}$ except for a case particularly designated as not. In FIG. 1, potentials at points "a" to "j" are designated by $V_a$ to $V_j$, and an output voltage from the output terminal 5 of the output circuit is $V_{OUT}$. The input terminal 4 is connected to gates of the PMOS transistor 6 and NMOS transistor 7 which are connected in series between the first power source 1 and the ground 3 and constitute a CMOS inverter gate circuit together. The PMOS transistor 6 and NMOS transistor 7 have their respective drains connected to gates of the PMOS transistor 8 and NMOS transistor 9 which are connected in series between the first power source 1 and the ground 3 and constitute another CMOS inverter gate circuit together. Similarly, the PMOS transistor 6 and NMOS transistor 7 have their respective drains connected to gates of the PMOS transistor 10 and NMOS transistor 11 which are connected in series between the first power source 1 and the ground 3 and constitute still another CMOS inverter gate circuit together. An intermediate potential generating circuit K1 which generates an intermediate potential is comprised of the PMOS transistor 12 and NMOS transistors 13 and 14 connected in series between the first power source 1 and the ground 3. The PMOS transistor 12 has its gate grounded, and the NMOS transistors 13 and 14 have their respective gates connected to their respective drains. The intermediate potential generating circuit K1 outputs a potential of the drain of the NMOS transistor 13 as an intermediate potential.

A first converting unit K2 receives the intermediate potential generated by the intermediate potential generating circuit K1 and receives an input signal received on the input terminal 4 through the two separate CMOS inverter gate circuits respectively formed of the PMOS transistor 6 and NMOS transistor 7, and the PMOS transistor 8 and NMOS transistor 9. The first converting unit K2 is formed of the PMOS transistors 15, 17 and the NMOS transistors 16, 18 connected in series between the second power source 2 and the ground 3. The PMOS 15 transistor has its gate connected to its drain, and its source connected to the second power source 2. The NMOS transistor 16 has its gate connected to the first power source 1 and its drain connected to a drain of the PMOS transistor 15. The PMOS transistor 17 has its gate connected to the drain of the NMOS transistor 13 and its source connected to a source of the NMOS transistor 16. The NMOS transistor 18 has its gate connected to drains of the PMOS transistor 8 and NMOS transistor 9, its source grounded, and its drain connected to a drain of the PMOS transistor 17.

A second converting unit K3 receives a voltage from the first converting unit K2 and receives the input signal through the CMOS inverter gate circuit formed of the PMOS transistor 6 and NMOS transistor 7. The second converting unit K3 is comprised of the PMOS transistors 19, 21 and NMOS transistors 20, 22 connected in series between the second power source 2 and the ground 3. The PMOS transistor 19 has its gate connected to the drain of the PMOS transistor 15 and its source connected to the second power source 2. The NMOS transistor 20 has its gate connected to the first power source 1 and its drain connected to a drain of the PMOS transistor 19. The PMOS transistor 21 has its gate connected to a drain of the NMOS transistor 20. The NMOS transistor 22 has its gate connected to the drains of the PMOS transistor 6 and NMOS transistor 7, its source grounded, and its drain connected to a drain of the PMOS transistor 21.

An output from the second converting unit K3 is applied to a gate of the PMOS transistor 23, and the PMOS transistor 23, in turn, has its source connected to the second power source 2 and its drain connected to the output terminal 5. The NMOS transistor 24 has its gate connected to drains of the PMOS transistor 10 and NMOS transistor 11, its source grounded, and its drain connected to the output terminal 5.

An operation of the output circuit will be described below. Now it is assumed that the logic threshold voltage of each of the CMOS inverter gate circuits respectively formed of the PMOS transistor 6 and NMOS transistor 7, the PMOS transistor 8 and NMOS transistor 9, and the PMOS transistor 10 and NMOS transistor 11 is $V_T$. The intermediate potential generating circuit K1 develops the intermediate potential; that is, it develops a potential $V_g$ to apply to the gates of the PMOS transistors 17 and 21. The potential $V_g$ is expressed by the following formula:

$$V_g = V_{TN13} + V_{TN14} \tag{1}$$

where $V_{TN13}$ and $V_{TN14}$ are threshold voltages of the NMOS transistors 13 and 14, respectively.

(1) A case in the event of $V_{IN} < V_T$ will be described.

The output voltages $V_a$, $V_b$ and $V_c$ of the CMOS inverter gate circuits respectively formed of the PMOS transistor 6 and NMOS transistor 7, the PMOS transistor 8 and NMOS transistor 9, and the PMOS transistor 10 and NMOS transistor 11 satisfy $V_a = V_{DD1}$, $V_b = V_{SS}$, and $V_c = V_{SS}$, respectively. Thus, the NMOS transistors 18 and 24 turn off, and the NMOS transistor 22 turns on. Since the NMOS transistor 18 is in its OFF state, the potential at the point "e" rises. When the potential at the point "e" satisfies the requirement expressed by the following formula, the NMOS transistor 16 turns off.

$$V_{DD1}-V_e>V_{TN16} \qquad (2)$$

This means the NMOS transistor 16 restricts the potential at the point "e" to a range expressed by the following formula (3). As will be recognized, a potential at the gate electrode of the PMOS transistor 19 never becomes lower than the potential at the point "e", and the PMOS transistor 19 is protected.

$$V_{DD1}-V_{TN16}>V_e \qquad (3)$$

At this time, the NMOS transistor 18 is in its OFF state, and therefore, the potential at the point "f" is obtained by the formula as follows:

$$V_f=V_{DD2}+V_{TP15} \qquad (4)$$

where $V_{TP15}$ is the threshold voltage of the PMOS transistor 15 and $V_{TN16}$ is the threshold voltage of the NMOS transistor 16 ($V_{TP15}<0$, $0<V_{TN16}$).

Since the gate–source voltage of the PMOS transistor 19 equals the potential difference between the potential at the point "f" and the potential $V_{DD2}$ of the second power source 2, $V_f-V_{DD2}$, the PMOS transistor 19 is in its slight conduction state. Since the NMOS transistor 22 turns on, the potential at the point "h" drops. When the potential $V_h$ at the point "h" satisfies the requirement expressed in the following formula, the PMOS transistor 21 turns off. Setting in advance the threshold voltage of the PMOS transistor 19 higher than the threshold voltage $V_{TP15}$ of the PMOS transistor 15, the current which flows in the PMOS transistor 19 can be decreased for an OFF period when the PMOS transistor 19 is in a slight conduction state.

$$V_g-V_h<V_{TP21} \qquad (5)$$

Thus, the PMOS transistor 21 restricts the potential at the point "h" to a range expressed by the following formula. As will be recognized, the potential at the point "h" never becomes higher than this potential range, and the NMOS transistor 22 is protected.

$$V_g-V_{TP21}<V_h \qquad (6)$$

Moreover, since the NMOS transistor 22 is in its ON state, the potential Vj at the point "j" is given by the following formula:

$$V_j=V_g-V_{TP21} \qquad (7)$$

where $V_{TP21}$ is the threshold voltage of the PMOS transistor 21 ($V_{TP21}<0$).

Since the gate–source voltage of the PMOS transistor 23 equals the potential difference between the potential at the point "j" and the potential $V_{DD2}$ of the second power source, $V_j-V_{DD2}$, it is in a heavy conduction state. Thus, the output voltage $V_{OUT}$ equals the potential difference between the potential $V_{DD2}$ of the second power source 2 and the ground potential $V_{SS}$, $V_{DD2}-V_{SS}$.

(2) A case in the event of $V_T<V_{IN}$ will be described.

The output voltages $V_a$, $V_b$ and $V_c$ of the CMOS inverter gate circuits respectively formed of the PMOS transistor 6 and NMOS transistor 7, the PMOS transistor 8 and NMOS transistor 9, and the PMOS transistor 10 and NMOS transistor 11 are $V_a=V_{SS}$, $V_b=V_{DD}$, and $V_c=V_{DD}$, respectively. Thus, the NMOS transistor 22 turns off, and the NMOS transistors 18, 24 turn on. Since the NMOS transistor 18 is in its ON state, the potential at the point "d" drops. When the potential at the point "d" satisfies the requirement expressed by the following formula, the PMOS transistor 17 turns off.

$$V_g-V_d<V_{TP17} \qquad (8)$$

Thus, the PMOS transistor 17 restricts the potential at the point "d" to a range expressed by the following formula. This means the potential at the point "d" never becomes higher than this potential range, and the NMOS transistor 18 is protected.

$$V_g-V_{TP17}>V_d \qquad (9)$$

Since the NMOS transistor 18 in its ON state, the voltage $V_f$ at the point "f" is given by the following formula:

$$V_f=V_g-V_{TP17} \qquad (10)$$

In this case, the gate–source voltage of the PMOS transistor 19 is ($V_f-V_{DD2}$), and therefore, the PMOS transistor 19 is in a heavy conduction state. Since the NMOS transistor 22 turns off, the potential at the point "i" rises. When the potential Vi at the point "i" satisfies the requirement expressed by the following formula, the NMOS transistor 20 turns off:

$$V_{DD1}-V_i<V_{TN20} \qquad (11)$$

Thus, the NMOS transistor 20 restricts the potential at the point "i" to a range expressed by the following formula. Hence, the potential of a gate electrode of the PMOS transistor 23 never becomes lower than the potential at the point "i", and the PMOS transistor 23 is protected.

$$V_{DD1}-V_{TN20}<V_i \qquad (12)$$

where $V_{TP17}$ is the threshold voltage of the PMOS transistor 17, and $V_{TN20}$ is the threshold voltage of the NMOS transistor 20 ($V_{TP17}<0$, $0<V_{TN20}$).

Since the NMOS transistor 22 turns off, the potential $V_j$ at the point "j" equals the potential $V_{DD2}$ of the second power source 2. The gate– source voltage of the PMOS transistor 23 equals the potential difference between the potential at the point "j" and the potential of the second power source 2, $V_j-V_{DD2}$, and therefore, the PMOS transistor 23 turns off. Thus, the output voltage $V_{OUT}$ is 0V.

As has been described, the output circuit in this embodiment receives the potential $V_{DD1}$ of the first power source 1 or the ground potential $V_{SS}$ as an input signal and converts it into the potential $V_{DD2}$ of the second power source 2 or the ground potential $V_{SS}$ to produce as an output signal.

EMBODIMENT 2

Figure 2:
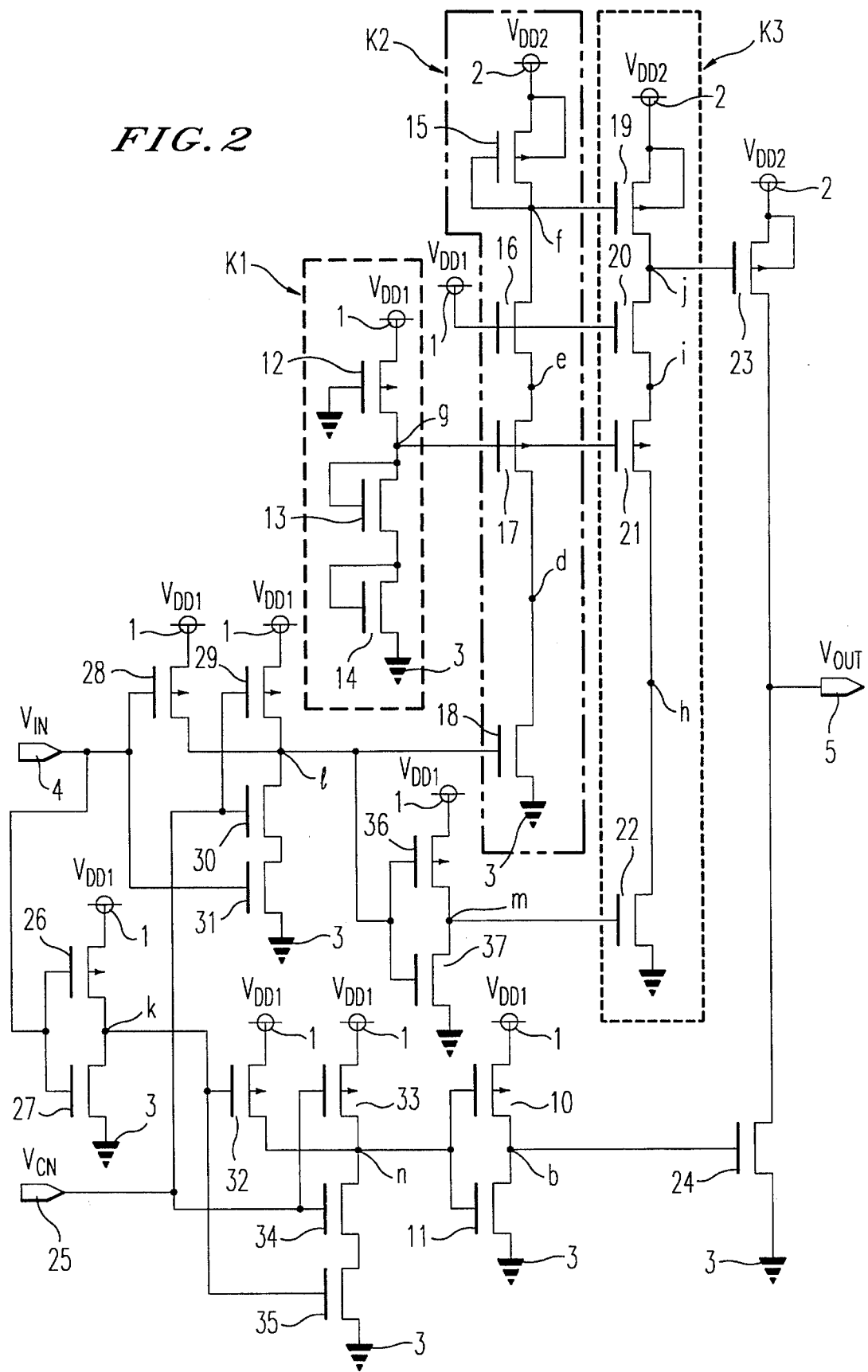
FIG. 2 is a diagram showing an output circuit of a semiconductor integrated circuit device according to a second preferred embodiment of the present invention.

A second preferred embodiment of the present invention will now be described with reference to a drawing. FIG. 2 is a circuit diagram showing a structure of an output circuit of a semiconductor integrated circuit device according to the second preferred embodiment of the present invention. The output circuit shown in FIG. 2 includes first power sources 1, second power sources 2, grounds 3, an input terminal 4 of the output circuit, an output terminal 5 of the output circuit, a control terminal 25 of the output circuit, PMOS transistors 10, 12, 15, 17, 19, 23, 26, 28, 29, 32 and 33, and NMOS transistors 11, 13, 14, 16, 18, 20, 22, 24, 27, 30, 31, 34 and 35.

It now is assumed that a potential output from the first power source 1 is $V_{DD1}$, a potential output from the second power source 2 is $V_{DD2}$, a potential of the ground 3 is $V_{SS}$, and voltages designated by $V_{IN}$ and $V_{CN}$ are applied to the input terminal 4 and the control terminal 25 of the output circuit, respectively. The potential $V_{DD1}$ of the first power source 1 is lower than the potential $V_{DD2}$ of the second power source 2 so as to assure reliability of a miniaturized MOS transistor. Substrate potentials of the NMOS transistors are all $V_{SS}$. Substrate potentials of the PMOS transistors are $V_{DD1}$ except for a case particularly designated as not. It is also assumed that voltages at points "b" and "d" to "n" in FIG. 2 are $V_b$ and $V_d$ to $V_n$, and an output voltage from the output terminal 5 of the output circuit is designated by $V_{OUT}$.

The output circuit of the semiconductor integrated circuit device shown in FIG. 2 is different from the output circuit shown in FIG. 1 in structures along the routes from the input terminal 4 to a first converting unit K2, a second converting unit K3, and the NMOS transistor 24, respectively. An output of a CMOS two-input NAND circuit, which is comprised of the PMOS transistors 28, 29 having their respective sources connected to the first power sources 1, the NMOS transistor 30 having its drain connected to drains of the PMOS transistors 28, 29, and the NMOS transistor 31 having its drain connected to a source of the NMOS transistor 30 and its source grounded, is connected to a gate of the NMOS transistor 18. The NAND circuit has its input connected to the input terminal 4 and the control terminal 25. The NAND circuit has its output connected to a gate of the NMOS transistor 22 through a CMOS inverter gate circuit comprised of the PMOS transistor 36 and the NMOS transistor 37.

Also, an output from a CMOS two-input NAND circuit, which is comprised of the PMOS transistors 32, 33 having their respective sources connected to the first power sources 1, the NMOS transistor 34 having its drain connected to drains of the PMOS transistors 32, 33, and the NMOS transistor 35 having its drain connected to a source of the NMOS transistor 34 and its source grounded, is input to a gate of the NMOS transistor 24 through a CMOS inverter gate circuit comprised of the PMOS transistor 10 and the NMOS transistor 11. The NAND circuit has its first input terminal connected to the control terminal 25, and it receives an input signal on its second input terminal from the input terminal 4 through a CMOS inverter gate circuit comprised of the PMOS transistor 26 and the NMOS transistor 27. Other components and configurations are similar to those shown in FIG. 1 in the context of the first preferred embodiment.

Now, an operation of the output circuit will be described. It now is assumed that the logic threshold voltage of the CMOS logic circuits and CMOS two-input NAND circuits is $V_T$. The PMOS transistor 12 and the NMOS transistors 13, 14 generate intermediate voltage $V_g$ to apply to the gates of the PMOS transistors 17 and 21, and the potential $V_g$ at the point "g" is given by the formula (1).

(1) A case in the event of $V_{CN}<V_T$ will be described.

Output voltage $V_1$ from the CMOS two-input NAND circuit comprised of the PMOS transistors 28, 29 and the NMOS transistors 30, 31 is $V_{DD1}$, and output voltage $V_k$ from the CMOS two-input NAND circuit comprised of the PMOS transistors 32, 33 and the NMOS transistors 34, 35 is $V_{DD1}$. Output voltages $V_m$ and $V_b$ from the CMOS inverter gate circuits respectively formed of the PMOS transistor 10 and NMOS transistor 11, and the PMOS transistor 36 and NMOS transistor 37 are $V_m = V_{SS}$ and $V_b = V_{SS}$, respectively. The NMOS transistors 22 and 24 turn off, and the NMOS transistor 18 turns on. Since the NMOS transistor 18 is in its ON state, the voltage $V_f$ at the point "f" roughly equals the potential $V_g$ at the point "g".

Thus, the gate–source voltage of the PMOS transistor 19 is $(V_f - V_{DD2})$, and therefore, the PMOS transistor 19 is in a heavy conduction state. Moreover, the NMOS transistor 22 turns off, the potential $V_j$ at the point "j" equals $V_{DD2}$. Since the gate–source voltage of the PMOS transistor 23 is $(V_j - V_{DD2})$, the PMOS transistor 23 turns off. Since both the PMOS transistor 23 and the NMOS transistor 24 turn off, the output terminal 5 is in a high impedance condition.

If the output terminal 5 in such a state takes the potential $V_{DD2}$ of the second power source 2, it never occurs that current reversely flows from the output terminal 5 toward the second power source 2 because the substrate potential of the PMOS transistor 23 is $V_{DD2}$.

(2) A case in the event of $V_T<V_{CN}$ and $V_T<V_{IN}$ will be described.

Output voltage $V_k$ from the CMOS inverter gate circuit formed of the PMOS transistor 26 and the NMOS transistor 27 is $V_{SS}$. Thus, output voltage $V_1$ from the CMOS two-input NAND circuit formed of the PMOS transistors 28, 29 and the NMOS transistors 30, 31 is $V_{SS}$, and the output voltage $V_n$ of the CMOS two-input NAND circuit formed of the PMOS transistors 32, 33 and the NMOS transistors 34, 35 is $V_{DD1}$. The output voltages $V_m$ and $V_b$ from the CMOS inverter gate circuits respectively comprised of the PMOS transistor 10 and NMOS transistor 11, and the PMOS transistor 36 and NMOS transistor 37 satisfy $V_m = V_{DD1}$ and $V_b = V_{SS}$, respectively. Since the NMOS transistors 18 and 24 turn off, the voltage $V_f$ at the point "f" is given by the formula (4) where $V_{TP15}$ is the threshold voltage of the PMOS transistor 15 ($V_{TP15}<0$).

The gate–source voltage of the PMOS transistor 19 is $(V_f - V_{DD2})$, and therefore, the PMOS transistor 19 is in a slight conduction state. Since the NMOS transistor 22 turns on, the voltage $V_j$ at the point "j" roughly equals the voltage $V_g$ at the point "g".

The gate–source voltage $V_j$ of the PMOS transistor 23 becomes $V_{DD2}$, and the PMOS transistor 23 is in a heavy conduction state. Thus, the output voltage $V_{OUT}$ is the potential difference between the potential $V_{DD2}$ of the second power source 2 and the ground potential $V_{SS}$, $V_{DD2} - V_{SS}$.

(3) A case in the event of $V_T<V_{CN}$ and $V_{IN}<V_T$ will be described.

The output voltage $V_k$ from the CMOS inverter gate circuit formed of the PMOS transistor 26 and NMOS transistor 27 is $V_{DD1}$. Thus, the output voltage $V_1$ of the CMOS two-input NAND circuit comprised of the PMOS transistors 28, 29 and the NMOS transistors 30, 31 is $V_{DD1}$, and the output voltage $V_n$ of the CMOS two-input NAND circuit comprised of the PMOS transistors 32, 33 and the NMOS transistors 34, 35 is $V_{SS}$. The output voltages $V_m$ and $V_b$ from the CMOS inverter gate circuits respectively formed of the PMOS transistor 10 and NMOS transistor 11, and the PMOS transistor 36 and NMOS transistor 37 satisfy $V_m = V_{SS}$ and $V_{b=VDD1}$, respectively. The NMOS transistor 22 turns off, and the NMOS transistors 18 and 24 turn on. Since the NMOS transistor 18 turns on, the voltage $V_f$ at the point "f" roughly equals the potential $V_g$ at the point "g".

The gate–source voltage of the PMOS transistor 19 is $(V_f - V_{DD2})$, and therefore, the PMOS transistor 19 is in a heavy conduction state. Since the NMOS transistor 22 turns off, the potential $V_j$ at the point "j" equals $V_{DD2}$.

The gate–source voltage of the PMOS transistor 21 is $(V_f - V_{DD2})$, and therefore, the PMOS transistor 21 is in a heavy conduction state. Thus, the output voltage $V_{OUT}$ is 0V.

EMBODIMENT 3

Figure 3:
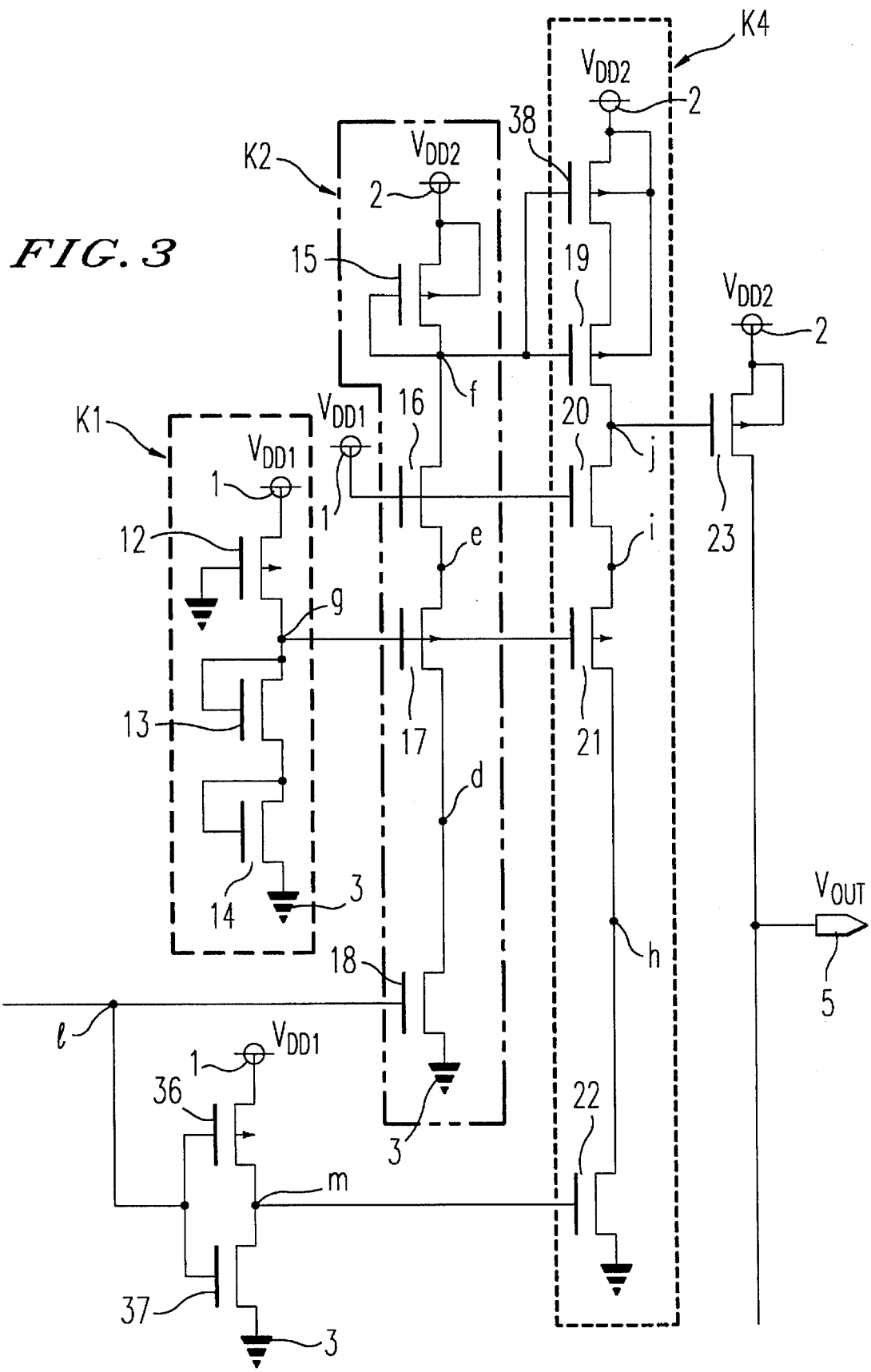
FIG. 3 is a diagram showing an output circuit of a semiconductor integrated circuit device according to a third preferred embodiment of the present invention.

A third preferred embodiment of the present invention will now be described. FIG. 3 is a circuit diagram showing a configuration of an output circuit of a semiconductor integrated circuit device according to the third preferred embodiment of the present invention, which depicts a method of another structure of a gate voltage signal producing circuit for the PMOS transistor 23 in the output circuit shown in FIG. 2. The circuit shown in FIG. 3 includes a PMOS transistor 38, and like reference numerals denote like components throughout FIGS. 2 and 3.

The output circuit shown in FIG. 3 is different from the output circuit shown in FIG. 2 in that a second converting unit K4 shown in FIG. 3, unlike the second converting unit K3 shown in FIG. 2, additionally includes the PMOS transistor 38 serving as a level shift circuit. The PMOS transistor 38 has its gate connected to a first power source 1, its source and substrate connected to a second power source 2, and its drain connected to a source of the PMOS transistor 19.

Figure 4:
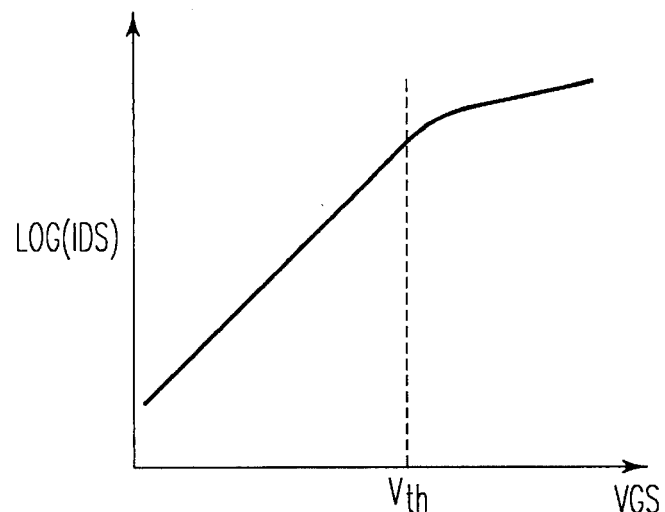
FIG. 4 is a graph illustrating a gate voltage—drain current characteristic of a MOS transistor.
Figure 14:
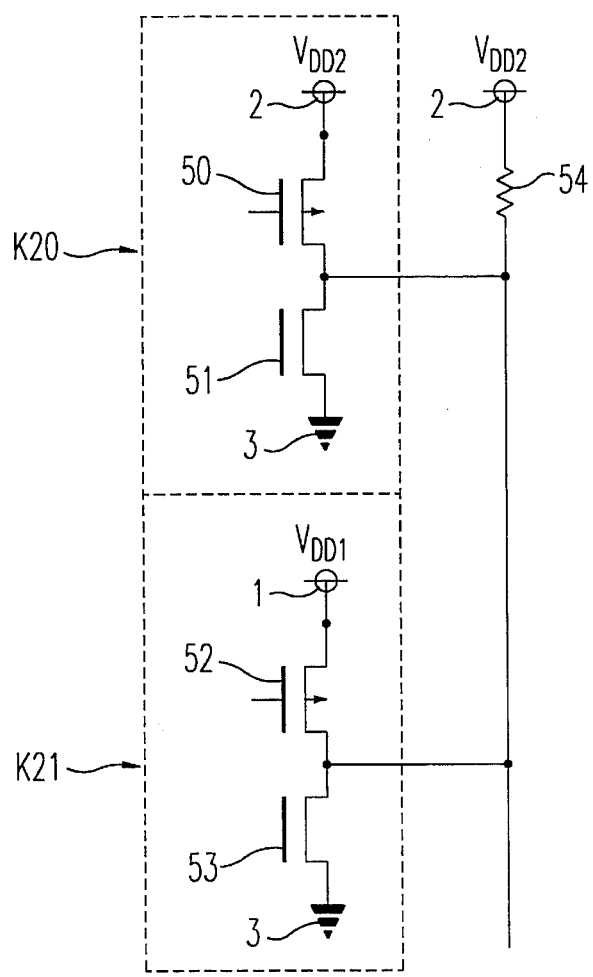
FIG. 14 is a diagram showing another prior art exemplary output circuit of a semiconductor integrated circuit device.

Now, an operation of the output circuit will be described. FIG. 4 illustrates a relation between gate–source voltage $V_{GS}$ and drain current $I_{DS}$ of a MOS transistor. The drain current $I_{DS}$ of the MOS transistor is exponentially decreased relative to the gate–source voltage $V_{GS}$ when the gate–source voltage $V_{GS}$ is at a level of the threshold voltage $V_{th}$ of the MOS transistor or under.

When $V_1 = V_{SS}$ is satisfied, output voltage $V_m$ of a CMOS inverter gate circuit formed of a PMOS transistor 36 and NMOS transistor 37 is $V_{DD1}$. Since an NMOS transistor 18 turns off, a potential $V_f$ at a point "f" is given by the formula (8). Since the gate–source voltage of the PMOS transistor 38 is $(V_{DD1} - V_{DD2})$, the PMOS transistor 38 is in a heavy conduction state. The gate–source voltage of the PMOS transistor 19 is $(V_f - V_{DD2})$, and therefore, the PMOS transistor 19 is in a slight conduction state. Since gate–source voltage of a PMOS transistor 23 is the potential difference between a potential $V_j$ at a point "j" and a potential $V_{DD2}$ of the second power source 2, $V_j - V_{DD2}$, the PMOS transistor 23 is in a heavy conduction state. Thus, output voltage $V_{OUT}$ equals the potential difference between the potential $V_{DD2}$ the second power source 2 and ground potential $V_{SS}$, namely, $V_{DD2} - V_{SS}$. Since an NMOS transistor 22 turns on, there lies a current path from the second power source 2 of potential $V_{DD2}$ through the PMOS transistors 38, 19, 21 and NMOS transistors 20, 22 to a ground 3 of potential $V_{SS}$. At this time, gate–source voltage of the PMOS transistor 19 is reduced by a voltage drop of the PMOS transistor 38 interposed between a source of the PMOS transistor 19 and the second power source 2. As can be seen in FIG. 4, there is an effect that the current flowing from the second power source 2 of potential $V_{DD2}$ through the PMOS transistors 38, 19, 21 and NMOS transistors 20, 22 to the ground of potential $V_{SS}$ is exponentially decreased to reduce power demand.

When $V_1 = V_{DD1}$ is satisfied, output voltage $V_m$ from the CMOS inverter gate circuit comprised of the PMOS transistor 36 and NMOS transistor 37 is $V_{DD1}$. Since the NMOS transistor 18 turns on, the potential $V_f$ at the point "f" is given in the formula (4). Since the gate–source voltage of the PMOS transistor 38 is expressed in $(V_{DD1} - V_{DD2})$, the PMOS transistor 38 is in a heavy conduction state. The gate–source voltage of the PMOS transistor 19 is expressed in $(V_f - V_{DD2})$, the PMOS transistor 19 is in a heavy conduction state. Thus, since the NMOS transistor 22 turns off, the potential $V_j$ at the point "j" equals the potential $V_{DD2}$ of the second poser source 2. Since the gate–source voltage of the PMOS transistor 23 is the potential difference between the potential at the point "j" and the potential $V_{DD2}$ of the second power source 2, $V_j - V_{DD2}$, the PMOS transistor 23 turns off. Thus, the output voltage $V_{OUT}$ from the output circuit becomes 0V.

EMBODIMENT 4

Figure 5:
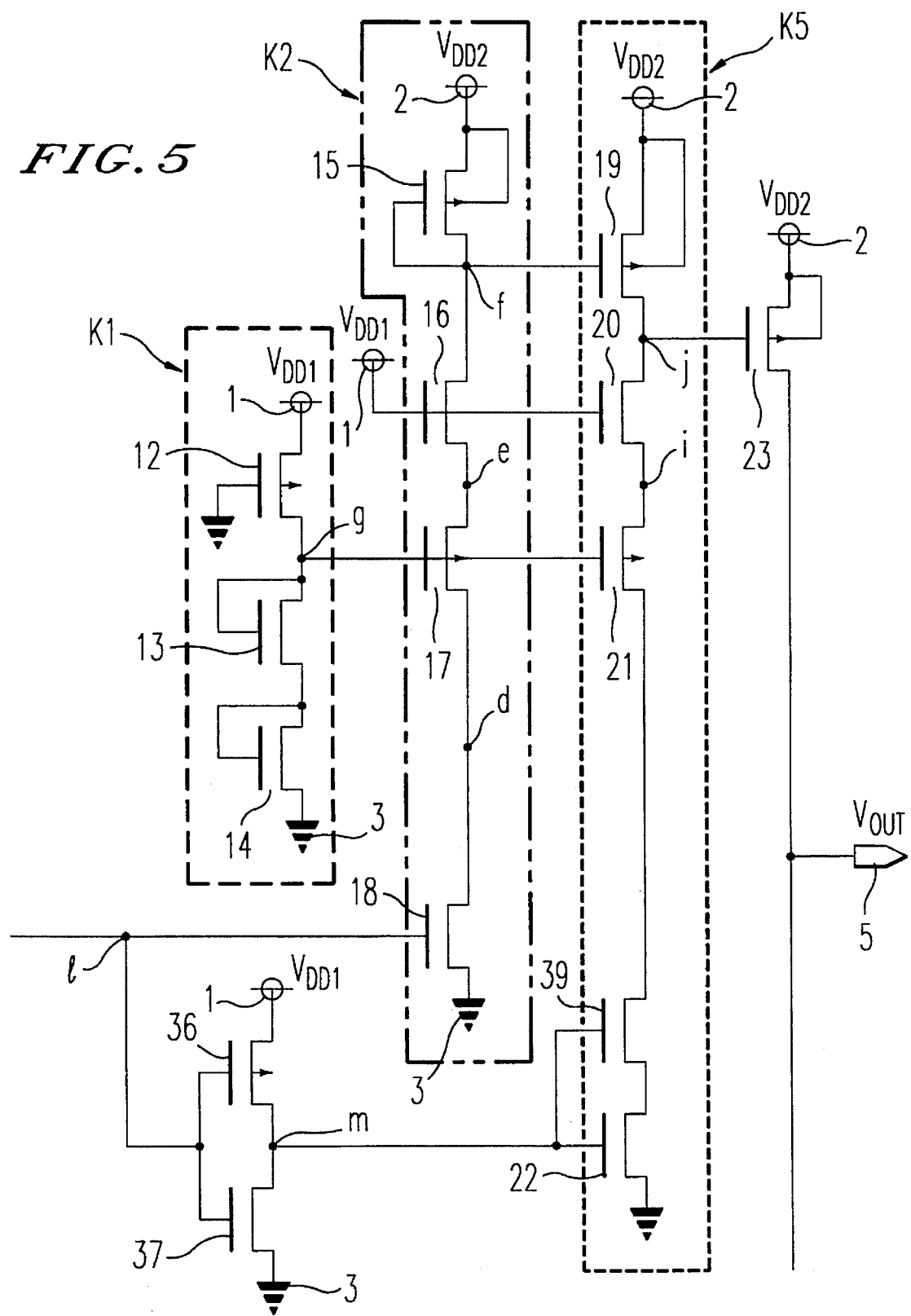
FIG. 5 is a diagram showing an output circuit of a semiconductor integrated circuit device according to a fifth preferred embodiment of the present invention.

An output circuit of a semiconductor integrated circuit device for practical use is affected by resistance, capacity and inductance parasitically developed in wirings for leading signal lines to the outside, or in power source lines or grounded circuits, and therefore, large noise is caused in the power source lines or grounded circuits when an output signal is quickly varied. To overcome this disadvantage, an output circuit of a semiconductor integrated circuit device according to a fourth preferred embodiment is designed by employing a method of restricting a changing rate of output signal per time. The fourth preferred embodiment of the present invention will be described below in conjunction with FIG. 5. FIG. 5 is a circuit diagram showing the output circuit of the semiconductor integrated circuit device of the fourth preferred embodiment of the invention, where reference numeral 39 denotes an NMOS transistor. Other like reference numerals denote corresponding components throughout FIG. 2 and FIG. 5.

The explanation of an operation of the output circuit, in the event that a potential $V_1$ at a point "1" equals $V_{DD1}$ or $V_{SS}$, is omitted because it is utterly the same as the output circuit shown in FIG. 2. Assuming now that the potential $V_1$ at the point "1" varies from $V_{DD1}$ to $V_{SS}$, an output from a CMOS inverter gate circuit comprised of a PMOS transistor 36 and NMOS transistor 37 varies from $V_{SS}$ to $V_{DD1}$. Since the NMOS transistors 22 and 39 are connected in series, gate voltage $V_j$ of the PMOS transistor 23 varies more dilatorily from $V_{DD2}$ to $V_{SS}$ compared with a case without the NMOS transistor 39 as shown in FIG. 2. Thus, since the PMOS transistor dilatorily turns to a heavier ON-state than the case without the NMOS transistor 39 as shown in FIG. 2, rapid variation in output voltage is suppressed, and a noise signal inducted by inductance of the output circuit can be reduced.

EMBODIMENT 5

Figure 6:
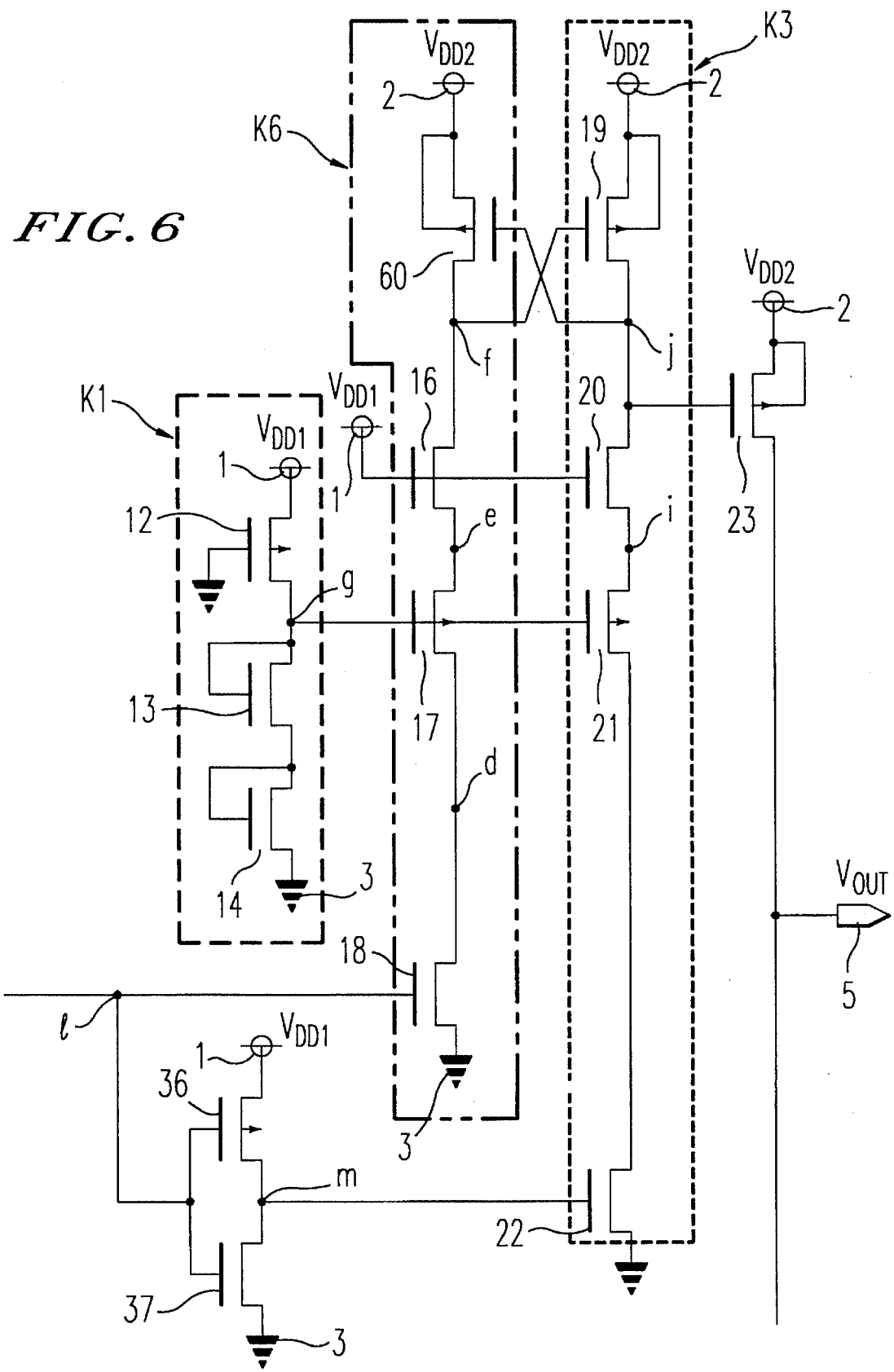
FIG. 6 is a diagram showing an exemplary output circuit of a semiconductor integrated circuit device according to a sixth preferred embodiment of the present invention.

A fifth preferred embodiment of the present invention will be described with reference to the drawings. FIG. 6 is a circuit diagram showing an output circuit of a semiconductor integrated circuit device in the first aspect of the fifth preferred embodiment of the present invention. FIG. 6 depicts an alternative configuration of the first converting unit which produces output to a gate electrode of the PMOS transistor 23 of the output circuit shown in FIG. 2, where reference numeral 60 denotes a PMOS transistor. Other like reference numerals denote corresponding components throughout FIG. 2 and FIG. 6.

The output circuit shown in FIG. 6 is different from the output circuit shown in FIG. 2 simply in that the PMOS transistor 60 of a first converting unit K6 shown in FIG. 6 has its gate connected to a point "j", although the PMOS transistor 15 of the first converting unit K2 shown in FIG. 2, which is the equivalent to the PMOS transistor 60, has its gate connected to the point "f". The PMOS transistor 60 receives an output from a second converting unit K3 on its gate electrode to alter a resistance value of the PMOS transistor 60 depending upon a state of the second converting unit K3.

Now an operation of the output circuit shown in FIG. 6 will be described. A PMOS transistor 36 and an NMOS transistor 37 together constitute a CMOS inverter gate circuit. A PMOS transistor 12 and NMOS transistors 13, 14 together constitute a circuit which generates a potential $V_g$ apply to gates of NMOS transistors 17, 21. The potential $V_g$ at a point "g" is given in the formula (1).

(1) A case in the event of $V_1 < V_T$ will be described.

Output voltage $V_m$ of the CMOS inverter gate circuit comprised of the PMOS transistor 36 and NMOS transistor 37 is $V_{DD1}$. The NMOS transistor 22 turns off while the NMOS transistor 18 turns on. Since the NMOS transistor 18 is in its ON-state, voltage $V_f$ at the point "f" is almost equal to the potential $V_g$ at the point "g".

Since gate–source voltage of the PMOS transistor 19 is $(V_f - V_{DD2})$, the PMOS transistor 19 is in a heavy conduction state. Since the NMOS transistor 22 turns off, a flow of current from the second power source 2 of potential $V_{DD2}$ through the PMOS transistors 19, 21 and NMOS transistors 20, 22 to the ground of potential $V_{SS}$ is blocked. At this time, the potential $V_j$ at the point "j" equals $V_{DD2}$.

Gate–source voltage of the PMOS transistor 60 becomes $(V_j - V_{DD2})$, and the PMOS transistor 60 turns off. Hence, the flow of current from the second power source 2 of potential $V_{DD2}$ through the PMOS transistors 60, 17 and NMOS transistors 16, 18 to the ground of potential $V_{SS}$ is blocked. Since gate–source voltage of the PMOS transistor 23 is $(V_j - V_{DD2})$, the PMOS transistor 23 is in its OFF-state.

(2) A case in the event of $V_T < V_1$ will be described.

Output voltage $V_m$ from the CMOS inverter gate circuit comprised of the PMOS transistor 36 and NMOS transistor 37 is $V_{SS}$. The NMOS transistor 22 turns on while the NMOS transistor 18 turns off. Since the NMOS transistor 22 is in its ON-state, the voltage $V_j$ at the point "j" equals the potential $V_g$ at the point "g".

Since the NMOS transistor 18 turns off and gate–source voltage of the PMOS transistor 60 is $(V_j - V_{DD2})$, the PMOS transistor 60 is in a heavy conduction state. Hence, the potential $V_f$ at the point "f" equals the potential $V_{DD2}$ of the second power source.

Since gate–source voltage of the PMOS transistor 19 is $(V_f - V_{DD2})$, the PMOS transistor 19 is in a heavy conduction state. Since gate–source voltage of the PMOS transistor 23 is $(V_j - V_{DD2})$, the PMOS transistor 23 is in a heavy conduction state. A flow of current from the second power source 2 of potential $V_{DD2}$ through the PMOS transistors 60, 17 and the NMOS transistors 16, 18 to the ground of potential $V_{SS}$ and a flow of current from the second power source 2 of potential $V_{DD2}$ through the PMOS transistors 19, 21 and the NMOS transistors 20, 22 to the ground of potential $V_{SS}$ are blocked by the NMOS transistor 18 and the PMOS transistor 19, respectively.

The output circuit of the semiconductor integrated circuit device of the fifth preferred embodiment is designed so that the state of the second converting unit K3 is changed to control current flowing in the first converting unit K6, and power demand for the first converting unit K6 can be reduced. Thus, any alternative configuration may be used where the current flowing in the first converting unit K6 is controlled depending upon the state of the second converting unit K3; for example, output circuits of a semiconductor integrated circuit device as shown in FIGS. 7 to 11 will have a similar effect.

Figure 7:
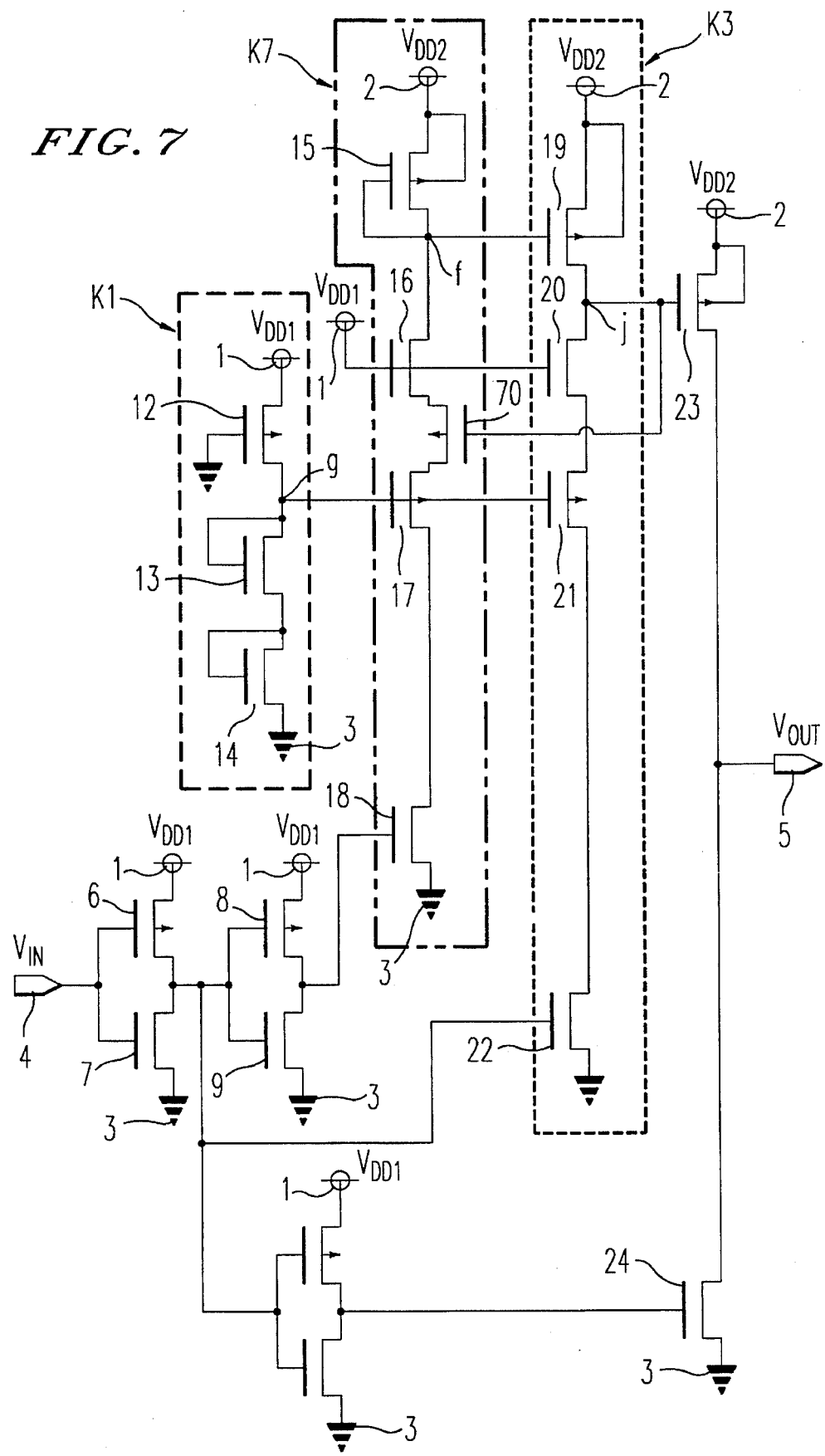
FIG. 7 is a diagram showing another exemplary output circuit of a semiconductor integrated circuit device according to the sixth preferred embodiment of the present invention.

FIG. 7 shows the output circuit of the semiconductor integrated circuit device, which is in the second aspect of the fifth preferred embodiment. The output circuit shown in FIG. 7 utilizes a PMOS transistor 70 to control current in a first converting unit K7. The first converting unit K7 receives an intermediate potential generated by an intermediate potential generating circuit K1 and also receives an input signal received on an input terminal 4 via two CMOS inverter gate circuits consisting of a PMOS transistor 6 and NMOS transistor 7, and a PMOS transistor 8 and NMOS transistor 9, respectively. The first converting unit K7 is comprised of PMOS transistors 15, 17, 70 and NMOS transistors 16, 18 connected in series between a second power source 2 and a ground 3. The PMOS transistor 15 has its gate connected to its drain, and its source connected to the second power source 2. The NMOS transistor 16 has its gate connected to a first power source 1, and its drain connected to a drain of the PMOS transistor 15. The PMOS transistor 70 has its gate connected to a drain of the PMOS transistor 19, and its source connected to a source of the NMOS transistor 16. The PMOS transistor 17 has its gate connected to a drain of the NMOS transistor 13, and its drain connected to a drain of the PMOS transistor 70. The NMOS transistor 18 has its gate connected to drains of the PMOS transistor 8 and NMOS transistor 9, its source grounded, and its drain connected to a drain of the PMOS transistor 17. Other like reference numerals denote corresponding components throughout FIG. 1 and FIG. 7.

As the potential $V_j$ at the point "j" becomes close to the potential $V_{DD2}$ of the second power source 2, a resistance value of the PMOS transistor 70 rises to suppress current flowing in the first converting unit K7.

Figure 8:
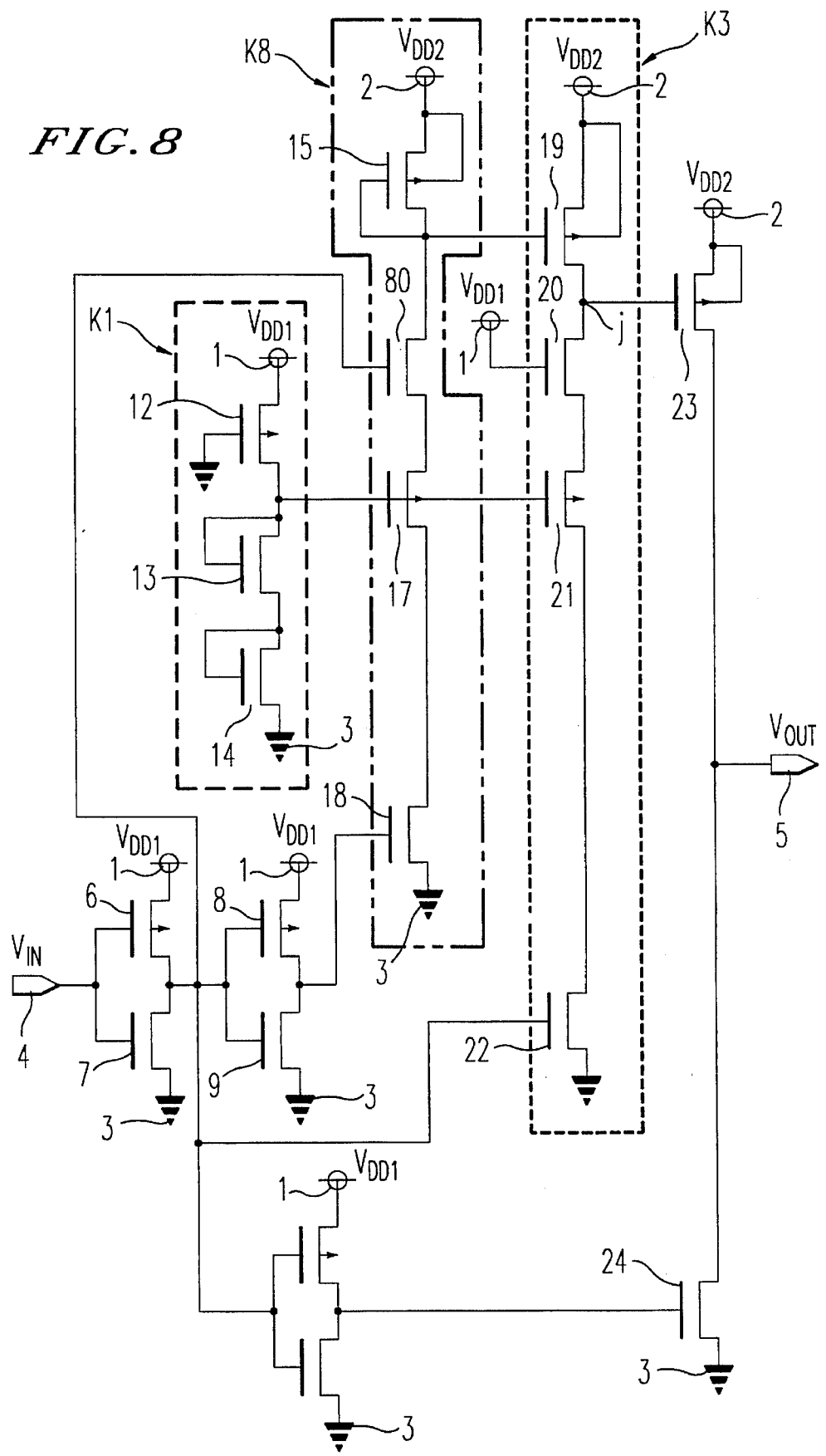
FIG. 8 is a diagram showing still another exemplary output circuit of a semiconductor integrated circuit device according to the sixth preferred embodiment of the present invention.

FIG. 8 depicts the output circuit of the semiconductor integrated circuit device, which is in the third aspect of the fifth preferred embodiment. The output circuit shown in FIG. 8 utilizes an NMOS transistor 80 to control current in a first converting unit K8. The first converting unit K8 receives an intermediate potential developed by an intermediate potential generating circuit K1 and also receives an input signal received on an input terminal 4 via two CMOS inverter gate circuits consisting of a PMOS transistor 6 and NMOS transistor 7 and a PMOS transistor 8 and NMOS transistor 9, respectively. The first converting unit K8 is comprised of PMOS transistors 15, 17 and NMOS transistors 80, 18 connected in series between a second power source 2 and a ground 3. The PMOS transistor 15 has its gate connected to its drain, and its source connected to the second power source 2. The NMOS transistor 80 has its gate connected to a first power source 1, and its drain connected to the drain of the PMOS transistor 15. The PMOS transistor 17 has its gate connected to a drain of the NMOS transistor 13, and its drain connected to the drain of the NMOS transistor 80. The NMOS transistor 18 has its gate connected to drains of the PMOS transistor 8 and NMOS transistor 9, its source grounded, and its drain connected to a drain of the PMOS transistor 17. Other like reference numerals denote corresponding parts in FIG. 1 and FIG. 8.

When the input signal is $V_{DD1}$, a potential of the gate of the NMOS transistor 80 drops while its resistance value rises, so that the current flowing in the first converting unit K8 is suppressed.

Figure 9:
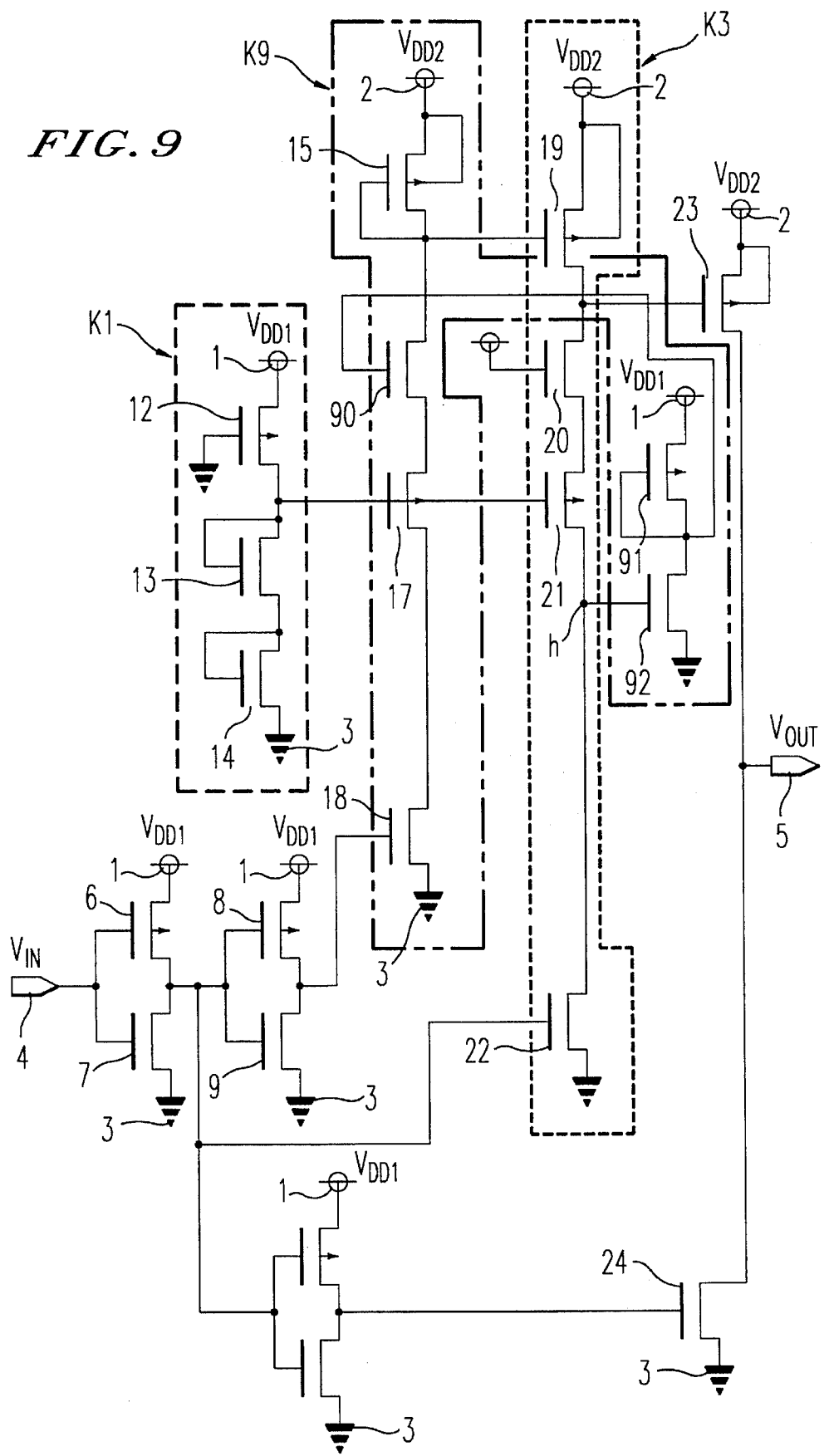
FIG. 9 is a diagram showing further another exemplary output circuit of a semiconductor integrated circuit device according to the sixth preferred embodiment of the present invention.

FIG. 9 is the output circuit of the semiconductor integrated circuit device, which is in the fourth aspect of the fifth preferred embodiment. The output circuit shown in FIG. 9 utilizes an NMOS transistor 90 to control current in a first converting unit K9. The first converting unit K9 receives an intermediate potential developed by an intermediate potential generating circuit K1 and also receives an input signal received on an input terminal 4 via two CMOS inverter gate circuits consisting of a PMOS transistor 6 and NMOS transistor 7 and a PMOS transistor 8 and NMOS transistor 9, respectively. The first converting unit K9 is comprised of PMOS transistors 15, 17 and NMOS transistors 90, 18 connected in series between a second power source 2 and a ground 3. The PMOS transistor 15 has its gate connected to its drain, and its source connected to the second power source 2. A PMOS transistor 91 has its source connected to a first power source 1. An NMOS transistor 92 has its source grounded, its drain connected to a gate and drain of the PMOS transistor 91, and its gate connected to a point "h". The NMOS transistor 90 has its gate connected to a drain of the PMOS transistor 91, and its drain connected to a drain of the PMOS transistor 15. The PMOS transistor 17 has its gate connected to a drain of the NMOS transistor 13, and its drain connected to a drain of the NMOS transistor 90. The NMOS transistor 18 has its gate connected to drains of the PMOS transistor 8 and NMOS transistor 9, its source grounded, and its drain connected to a drain of the PMOS transistor 17. Other like reference numerals denote corresponding parts throughout FIG. 1 and FIG. 9.

Since rising of a potential $V_h$ at the point "h" causes the NMOS transistor 90 to turn on, a resistance value of the NMOS transistor 90 rises to suppress current flowing in the first converting unit K9.

Figure 10:
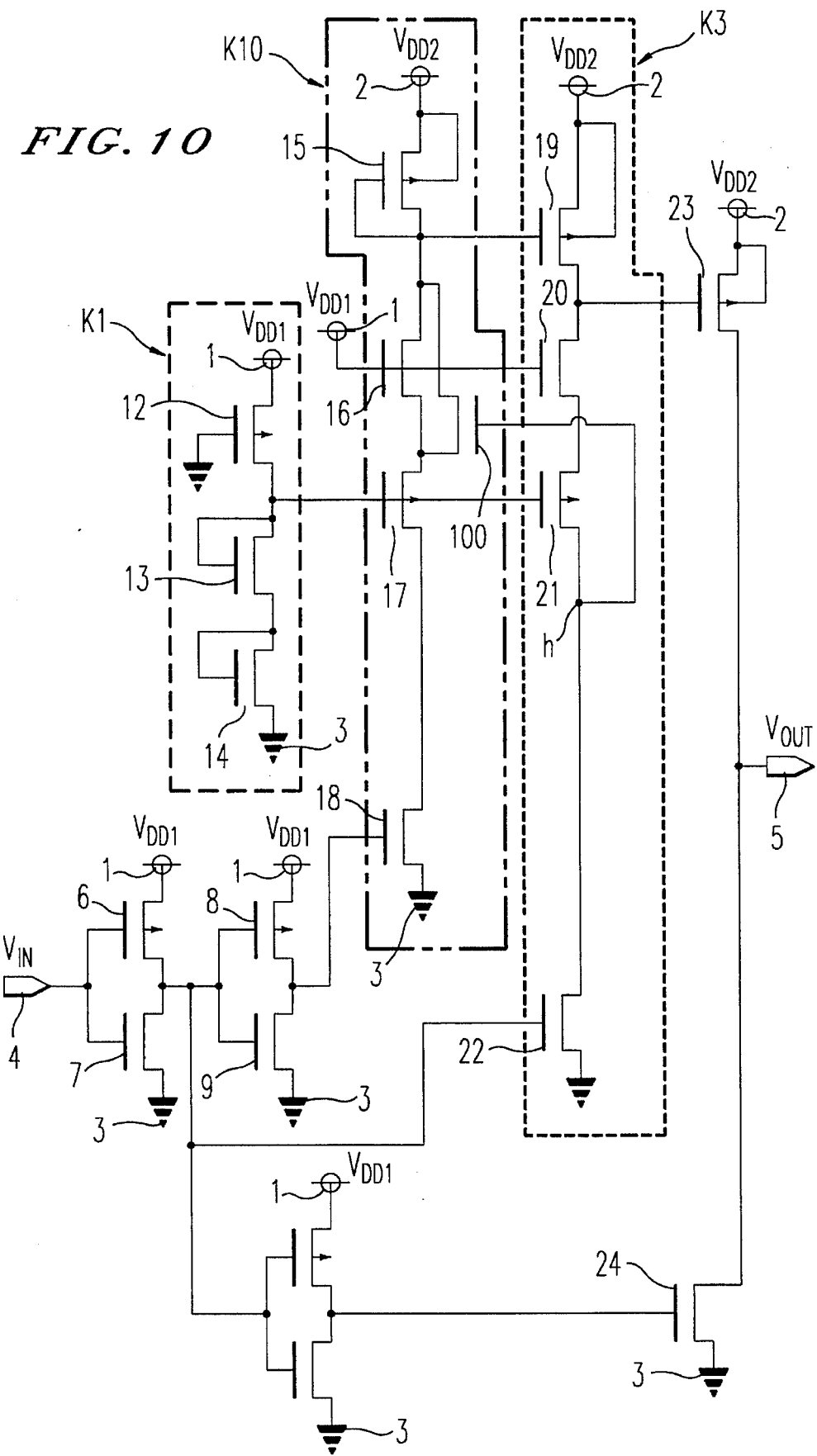
FIG. 10 is a diagram showing yet another exemplary output circuit of a semiconductor integrated circuit device according to the sixth preferred embodiment of the present invention.

FIG. 10 depicts the output circuit of the semiconductor integrated circuit device, which is in the fifth aspect of the fifth preferred embodiment. The output circuit shown in FIG. 10 utilizes an NMOS transistor 100 to control current in a first converting unit K10. The first converting unit K10 receives an intermediate potential developed by an intermediate potential generating circuit K1 and also receives an input signal received on an input terminal 4 via two CMOS inverter gate circuits consisting of a PMOS transistor 6 and NMOS transistor 7 and a PMOS transistor 8 and NMOS transistor 9, respectively. The first converting unit K10 is comprised of PMOS transistors 15, 17 and NMOS transistors 16, 18, 100 connected in series between a second power source 2 and a ground 3. The PMOS transistor 15 has its gate connected to its drain, and its source connected to the second power source 2. The NMOS transistor 16 has its gate connected to a first power source 1, and its drain connected to the drain of the PMOS transistor 15. The PMOS transistor 17 has its gate connected to a drain of an NMOS transistor 13. The NMOS transistor 18 has its gate connected to drains of the PMOS transistor 8 and NMOS transistor 9, its source grounded, and its drain connected to a drain of the PMOS transistor 17. The NMOS transistor 100 is connected in parallel with the NMOS transistor 16 and has its gate connected to a point "h". Other like reference numerals denote corresponding parts throughout FIG. 1 and FIG. 10.

As a potential $V_h$ at the point "h" rises, a resistance value of the NMOS transistor 100 rises to suppress current flowing in the first converting unit K10.

Figure 11:
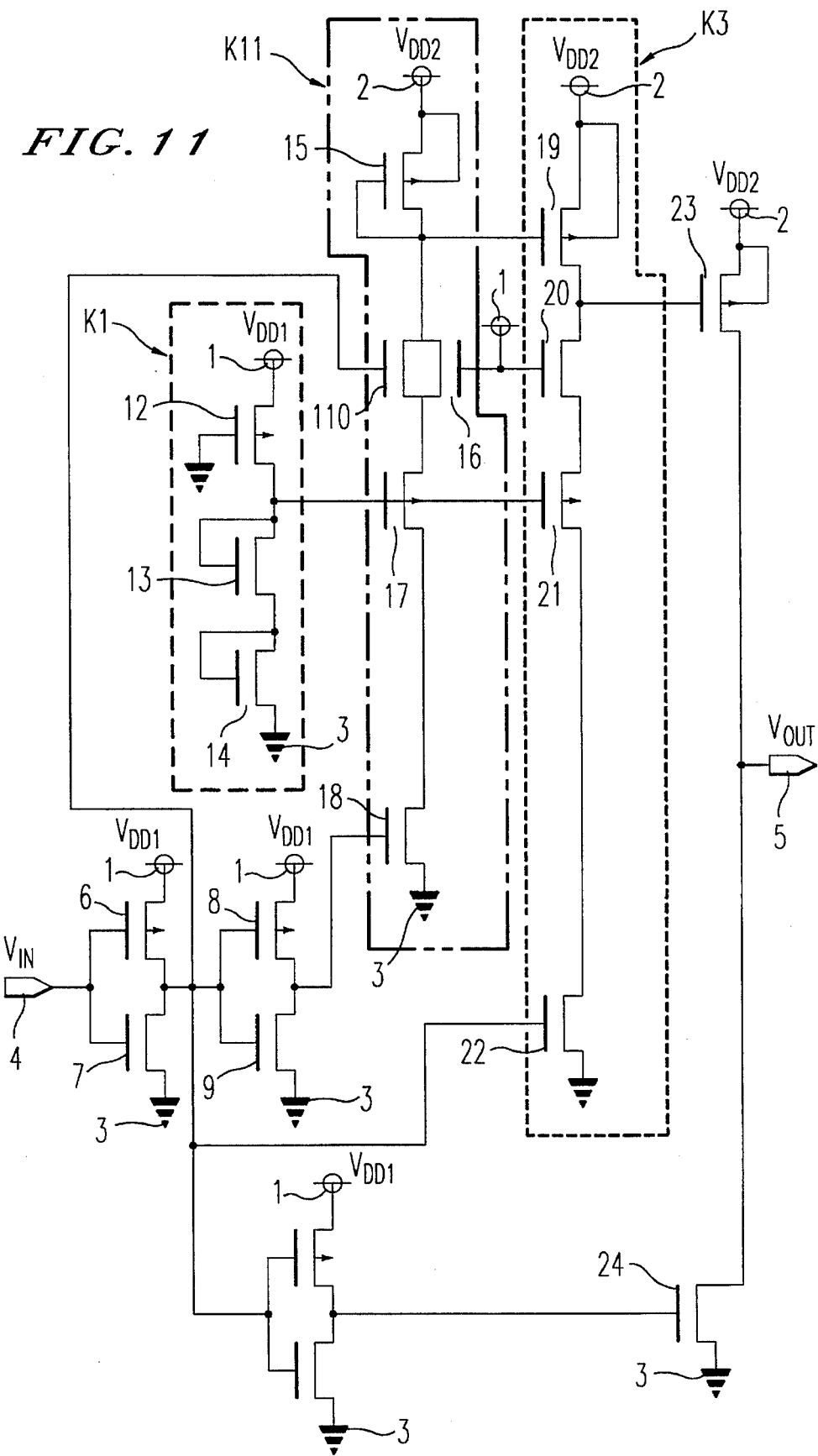
FIG. 11 is a diagram showing still yet another exemplary output circuit of a semiconductor integrated circuit device according to the sixth preferred embodiment of the present invention.
Figure 12:
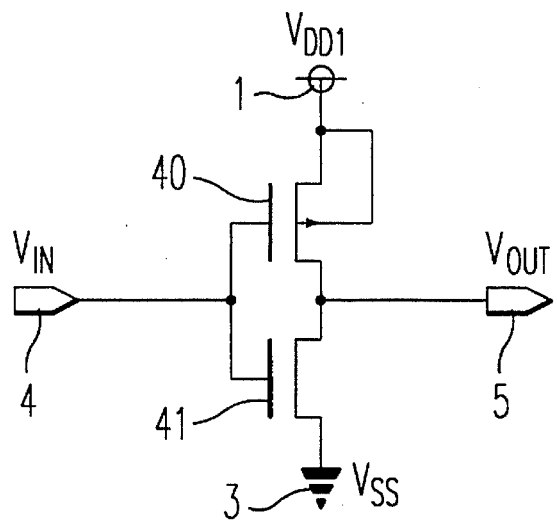
FIG. 12 is a diagram showing a prior art exemplary output circuit of a semiconductor integrated circuit device.
Figure 13:
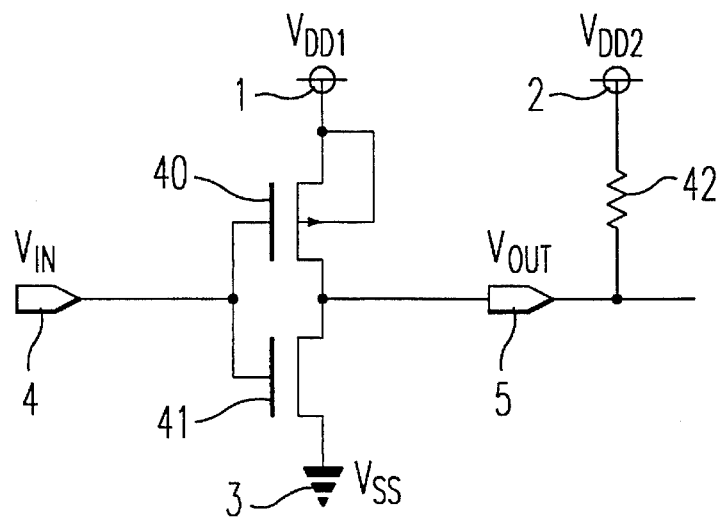
FIG. 13 is a diagram showing the prior art exemplary output circuit of the semiconductor integrated circuit device.

FIG. 11 depicts the output circuit of the semiconductor integrated circuit device, which is in the sixth aspect of the fifth preferred embodiment. The output circuit shown in FIG. 11 utilizes a PMOS transistor 110 to control current flowing in a first converting unit K11. The first converting unit K11 receives an intermediate potential generated by an intermediate potential generator circuit K1 and also receives an input signal received on an input terminal 4 via two CMOS inverter gate circuits consisting of a PMOS transistor 6 and NMOS transistor 7 and a PMOS transistor 8 and NMOS transistor 9, respectively. The first converting unit K11 is comprised of PMOS transistors 15, 17 and NMOS transistors 16, 18, 110 connected in series between a second power source 2 and a ground 3. The PMOS transistor 15 has its gate connected to its drain, and its source connected to the second power source 2. The NMOS transistor 16 has its gate connected to a first power source 1, and its drain connected to a drain of the PMOS transistor 15. The PMOS transistor 17 has its gate connected to a drain of the NMOS transistor 13. The NMOS transistor 18 has its gate connected to drains of the PMOS transistor 8 and NMOS transistor 9, its source grounded, and its drain connected to a drain of the PMOS transistor 17. The NMOS transistor 110 is connected in parallel with the NMOS transistor 16, and it has its gate connected to drains of the PMOS transistor 6 and NMOS transistor 7. Other like reference numerals denote corresponding parts throughout FIG. 1 and FIG. 11.

When the input signal is $V_{DD1}$, a resistance value of the NMOS transistor rises to suppress current flowing in the first converting unit K11.

While the invention has been shown and described in detail, the foregoing description is in all aspects illustrative and not restrictive. It is therefore understood that numerous modifications and variations can be devised without departing from the scope of the invention.

What is claimed is:

1. An output circuit of a semiconductor integrated circuit device, said output circuit including an input terminal for receiving an input signal which oscillates between a first potential and a second potential lower than said first potential and an output terminal for outputting an output signal which oscillates between a third potential and a fourth potential, wherein the third potential is higher than said first potential and said fourth potential is higher than or equal to said second potential, said output circuit comprising:

a first insulated gate transistor of a first conductivity type having one current electrode for receiving said third potential, another current electrode connected to said output terminal of said output circuit, a control electrode, and a substrate potential which is equal to said third potential;

an intermediate potential generating circuit;

a first converting unit; and a second converting part, wherein said intermediate potential generating circuit generates a first intermediate potential which is between said first and second potentials, wherein said first converting unit includes:

voltage drop means having one end for receiving said third potential and another end;

a second insulated gate transistor of a second conductivity type having a control electrode for receiving a second intermediate potential which is equal to said first potential between said first intermediate potential and said third potential, one current electrode, and another current electrode which is connected to said another end of said voltage drop means; and a third insulated gate transistor of the first conductivity type having a control electrode for receiving said first intermediate potential, one current electrode which is connected to said one current electrode of said second insulated gate transistor, and another current electrode, said first converting unit receives said input signal, and changes a potential at said another current electrode of said third insulated gate transistor in accordance with said input signal so that a first signal is outputted from said another current electrode of said second insulated gate transistor, said first signal oscillating between a fifth potential close to said third potential and a sixth potential lower than said fifth potential generated in accordance with said input signal, and wherein said second converting unit includes:

a fourth insulated gate transistor of the first conductivity type having one current electrode for receiving said third potential, a control electrode for receiving said first signal, and another current electrode for outputting a second signal to said control electrode of said first insulated gate transistor;

a fifth insulated gate transistor of the second conductivity type having a control electrode for receiving said second intermediate potential, one current electrode connected to said another current electrode of said fourth insulated gate transistor, and another current electrode; and a sixth insulated gate transistor of the first conductivity type having a control electrode for receiving said first intermediate potential, one current electrode connected to said another current electrode of said fifth insulated gate transistor, and another current electrode, said second converting unit receives an inverse input signal having a logic value which is an inverse of a logic value of said input signal and changes a potential at said another current electrode of said sixth insulated gate transistor in accordance with said inverse input signal so that said second signal is outputted in response to said first signal.

2. The output circuit of the semiconductor integrated circuit device according to claim 1, further comprising a seventh insulated gate transistor of the second conductivity type having one current electrode for receiving said second potential, another current electrode which is connected to said output terminal of said output circuit, and a control electrode.

3. The output circuit of the semiconductor integrated circuit device according to claim 2, further comprising a control circuit provided prior to said input signal potential converting circuit to receive said input signal and a control signal, and in accordance with said control signal said control circuit outputs said input signal to said first insulated gate transistor and said inverse input signal to said seventh insulated gate transistor, or changes and outputs said input signal and said inverse input signal regardless of said input signal so as to turn off both said first and seventh insulated gate transistors.

4. The output circuit of the semiconductor integrated circuit device according to either of claims 1 or 2, further comprising an eighth insulted gate transistor of the second conductivity type having one current electrode for receiving said second potential, another current electrode which is connected to said another current electrode of said third insulated gate transistor, and a control electrode for receiving said input signal.

5. The output circuit of the semiconductor integrated circuit device according to either of claims 1 or 2, further comprising a ninth insulated gate transistor of the second conductivity type having one current electrode for receiving said second potential, another current electrode which is connected to said another current electrode of said sixth insulated gate transistor, and a control electrode for receiving said inverse input signal.

6. The output circuit of the semiconductor integrated circuit device according to claim 5, wherein said control circuit includes:

a first NAND circuit having a first input terminal receiving said input signal, a second input terminal receiving said control signal, and an output terminal for outputting said input signal as it is changed to said control electrode of said eighth insulated gate transistor;

a first inverter gate circuit having an input terminal receiving said input signal, and an output terminal;

a second NAND circuit having a first input terminal connected to said output terminal of said inverter gate circuit, a second input terminal receiving said control signal, and an output terminal;

a second inverter gate circuit having an input terminal connected to said output terminal of said first NAND circuit, and an output terminal connected to said control electrode of said ninth insulated gate transistor; and a third inverter gate circuit having an input terminal connected to said output terminal of said second NAND circuit, and an output terminal connected to said control electrode of said seventh insulated gate transistor.

7. The output circuit of the semiconductor integrated circuit device according to claim 6, wherein said second converting unit includes a level shift circuit connected between said one current electrode of said fourth insulated gate transistor and said third potential for increasing a voltage drop between said Second potential and said one current electrode of said fourth insulted gate transistor when the potential difference between said control electrode of said fourth insulated gate transistor and said one current electrode of said fourth insulated gate transistor decreases to cause transition of said fourth insulated gate transistor into an OFF-state.

8. The output circuit of the semiconductor integrated circuit device according to claim 7, wherein said level shift includes a tenth insulated gate transistor of the first conductivity type having one current electrode connected to said third potential, another current-electrode connected to said one current electrode of said fourth insulated gate transistor, and a control electrode for receiving said second intermediate potential.

9. The output circuit of the semiconductor integrated circuit device according to claim 6, wherein said voltage dropping means includes a tenth insulted gate transistor of the first conductivity type having one current electrode connected to said third potential, another current electrode which is connected to said another current electrode of said second insulated gate transistor, and a control electrode which is connected to said another-current electrode of said second insulted gate transistor, and wherein said fourth insulated gate transistor has a higher threshold voltage than said tenth insulted gate transistor.

10. The output circuit of the semiconductor integrated circuit device according to claim 6, wherein said second converting unit further includes resistance means which is inserted between said another current electrode of said sixth insulated gate transistor, said resistance means having one end which is connected to said another current electrode of said sixth insulated gate transistor, and another end which is connected to said another current electrode of said ninth insulated gate transistor.

11. The output circuit of the semiconductor integrated circuit device according to claim 10, wherein said resistance means includes an eleventh insulated gate transistor of the second conductivity type having one current electrode which is connected to said another current electrode of said eighth insulated gate transistor, another current electrode which is connected to said another current electrode of said ninth insulated gate transistor, and a control electrode which is connected to said control electrode of said ninth insulated gate transistor.

12. The output circuit device of the semiconductor integrated circuit device according to claim 6, wherein said intermediate potential generating circuit includes:
    a twelfth insulated gate transistor of the first conductivity type having one current electrode for receiving said first potential, a control electrode for receiving said second potential, and another current electrode,
    a thirteenth insulated gate transistor of the second conductivity type having one current electrode which is connected to said another current electrode of said twelfth insulated gate transistor, a control electrode which is connected to said another current electrode of said twelfth insulated gate transistor, and another current electrode, said thirteenth insulated gate transistor outputting a potential at its one current electrode as said first intermediate potential; and
    a fourteenth insulated gate transistor of the second conductivity type having one current electrode which is connected to said another current electrode of said thirteenth insulated gate transistor, a control electrode which is connected to said another current electrode of said thirteenth insulated gate transistor, and another current electrode for receiving said second potential.

13. The output circuit of the semiconductor integrated circuit device according to claim 1, wherein said second converting unit further includes a level shift circuit which is disposed between said one current electrode of said fourth insulated gate transistor and said third potential, said level shift circuit increasing a voltage drop between said second potential and said one current electrode of said fourth insulated gate transistor when the potential difference between said control electrode of said fourth insulated gate transistor and said one current electrode of said fourth insulated gate transistor decreases to cause transition of said fourth insulated gate transistor into an OFF-state.

14. The output circuit of the semiconductor integrated circuit device according to claim 13, wherein said level shift circuit includes a tenth insulated gate transistor of the first conductivity type having one current electrode for receiving said third potential, another current electrode which is connected to said one current electrode of said fourth insulated gate transistor, and a control electrode for receiving said second intermediate potential.

15. The output circuit of the semiconductor insulated gate transistor according to claim 1, wherein said voltage dropping means includes a tenth insulated gate transistor of the first conductivity type having one current electrode for receiving said third potential, another current electrode which is connected to said another current electrode of said second insulated gate transistor, and a control electrode which is connected to said another current electrode of said second insulated gate transistor,
    and wherein said fourth insulated gate transistor has a higher threshold voltage than said tenth insulated gate transistor.

16. The output circuit of the semiconductor insulated gate transistor according to claim 1, wherein said second converting unit further includes a ninth insulated gate transistor of the second conductivity type having one current electrode for receiving said second potential, another current electrode which is connected to said another current electrode of said sixth insulated gate transistor, and a control electrode for receiving said inverse input signal.

17. The output circuit of the semiconductor integrated circuit device according to claim 16, wherein said second converting unit further includes resistance means which is inserted between said another current electrode of said sixth insulated gate transistor and said another current electrode of said ninth insulated gate transistor, said resistance means having one end which is connected to said another current electrode of said sixth insulated gate transistor, and another end which is connected to said another current electrode of said ninth insulated gate transistor.

18. The output circuit of the semiconductor integrated circuit device according to claim 17, wherein said resistance means includes an eleventh insulated gate transistor of the second conductivity type having one current electrode which is connected to said another current electrode of said ninth insulated gate transistor, another current electrode which is connected to said another current electrode of said sixth insulated gate transistor, and a control electrode which is connected to said control electrode of said ninth insulated gate transistor.

19. The output circuit of the semiconductor integrated circuit device according to claim 1, wherein said intermediate potential generating circuit includes:
    a twelfth insulated gate transistor of the first conductivity type having one current electrode for receiving said first potential, a control electrode for receiving said second potential, and another current electrode;
    a thirteenth insulated gate transistor of the second conductivity type having one current electrode which is connected to said another current electrode of said twelfth insulate gate transistor, a control electrode which is connected to said another current electrode of said twelfth insulated gate transistor, and another current electrode, said thirteenth insulated gate transistor outputting a potential at said one current electrode of said thirteenth insulated gate transistor as said first intermediate potential; and
    a fourteenth insulated gate transistor of the second conductivity type having one current electrode which is connected to said another current electrode of said thirteenth insulated gate transistor, a control electrode which is connected to said another current electrode of said thirteenth insulated gate transistor, and another current electrode for receiving said second potential.

20. The output circuit of the semiconductor integrated circuit device according to claim 1, wherein said first converting unit further includes current limit means serially interposed in a current path which includes said second and said third insulated gate transistors, said current limit means limiting a current in said current path in accordance with a condition of said first or said second converting unit.

21. The output circuit of the semiconductor integrated circuit device according to claim 20, wherein said current limit means includes a seventh insulated gate transistor of the first conductivity type which is inserted between said second and said third insulated gate transistors, said seventh insulated gate transistor having a control electrode for receiving said second signal which is outputted by said second converting unit, one current electrode which is connected to said one current electrode of said second insulated gate transistor, and another current electrode which is connected to said one current electrode of said third insulated gate transistor.

22. The output circuit of the semiconductor integrated circuit device according to claim 20, wherein said voltage drop means and said current limit means include a fifteenth insulated gate transistor of the first conductivity type having one current electrode for receiving said third potential, another current electrode which is connected to said another current electrode of said second insulated gate transistor, and a control electrode for receiving said second signal.

23. The output circuit of the semiconductor integrated circuit device according to claim 20, wherein said second potential is supplied to said control electrode of said second insulated gate transistor when a value of said input signal is equal to said second potential, and a potential which turns off said second insulated gate transistor is supplied to said control electrode of said second insulated gate transistor when a value of said input signal is equal to said first potential.

24. The output circuit of the semiconductor integrated circuit device according to claim 23, wherein said inverse signal is supplied to said control electrode of said second insulated gate transistor.

25. The output circuit of the semiconductor integrated circuit device according to claim 23, wherein said first converting unit further includes:

a sixteenth insulated gate transistor of the second conductivity type having a control electrode which is connected to said another current electrode of said sixth insulated gate transistor, one current electrode for receiving said second potential, and another current electrode; and a seventeenth insulated gate transistor of the first conductivity type having one current electrode for receiving said first potential, another current electrode which is connected to said another current electrode of said sixteenth insulated gate transistor, and a control electrode which is connected to said another current electrode of said seventh insulated gate transistor, and wherein said current electrode of said second insulated gate transistor is connected to said another current electrode of said eighth insulated gate transistor.

26. The output circuit of the semiconductor integrated circuit device according to claim 1, wherein said first converting unit further includes current limit means serially interposed in a current path which includes said second and said third insulated gate transistors, said current limit means limiting a current in said current path in accordance with a condition of said first or said second converting unit.

27. The output circuit of the semiconductor integrated circuit device according to claim 26, wherein said current limit means includes an eighteenth insulated gate transistor of the second conductivity type which is connected in parallel to said second insulated gate transistor, said eighteenth insulated gate transistor having a control electrode which is connected to said another current electrode of said sixth insulated gate transistor.

28. The output circuit of the semiconductor integrated circuit device according to claim 26, wherein said current limit means includes a nineteenth insulated gate transistor of the second conductivity type which is connected in parallel to said second insulated gate transistor, said nineteenth insulated gate transistor having a control electrode for receiving said inverse input signal.

29. The output circuit of the semiconductor integrated circuit device according to claim 1, wherein said second intermediate potential includes said first potential.

30. The output circuit of the semiconductor integrated circuit device according to claim 29, wherein said first converting unit further includes an eighth insulated gate transistor of the second conductivity type having one current electrode for receiving for receiving said second potential, another current electrode which is connected to said another current electrode of said third insulated gate transistor, and a control electrode for receiving said input signal.

31. The output circuit of the semiconductor integrated circuit device according to claim 29, wherein said second converting unit further includes a ninth insulated gate transistor of the second conductivity type having one current electrode for receiving said second potential, another current electrode which is connected to said another current electrode of said sixth insulated gate transistor, and a control electrode for receiving said inverse input signal.

32. The output circuit of the semiconductor integrated circuit device according to claim 29, further including a seventh insulated gate transistor of the second conductivity type having one current electrode for receiving said second potential, another current electrode which is connected to said output terminal and a control electrode for receiving said input signal.

* * * * *